(12) United States Patent
Yamazaki et al.

(10) Patent No.: US 8,106,474 B2
(45) Date of Patent: Jan. 31, 2012

(54) SEMICONDUCTOR DEVICE

(75) Inventors: Shunpei Yamazaki, Tokyo (JP); Jun Koyama, Kanagawa (JP); Hideaki Shishido, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 288 days.

(21) Appl. No.: 12/423,536

(22) Filed: Apr. 14, 2009

(65) Prior Publication Data

US 2009/0261444 A1    Oct. 22, 2009

(30) Foreign Application Priority Data

Apr. 18, 2008   (JP) .................................. 2008-108896

(51) Int. Cl.
    *H01L 31/00* (2006.01)
(52) U.S. Cl. ....................................... 257/459; 257/691
(58) Field of Classification Search .................. 257/459, 257/691
    See application file for complete search history.

(56) References Cited

U.S. PATENT DOCUMENTS

| | | | |
|---|---|---|---|
| 5,483,099 A * | 1/1996 | Natarajan et al. ............. | 257/691 |
| 5,639,989 A | 6/1997 | Higgins, III | |
| 5,689,133 A | 11/1997 | Li et al. | |
| 5,825,601 A | 10/1998 | Statz et al. | |
| 6,194,786 B1 * | 2/2001 | Orcutt ............................ | 257/780 |
| 6,310,379 B1 | 10/2001 | Andresen et al. | |
| 6,492,707 B1 | 12/2002 | Kaku et al. | |
| 6,545,321 B2 | 4/2003 | Morishita | |
| 7,030,455 B2 | 4/2006 | Gamand et al. | |
| 7,566,971 B2 | 7/2009 | Matsuzaki | |
| 2006/0267202 A1 | 11/2006 | Matsuzaki | |
| 2007/0108521 A1 | 5/2007 | Dekker | |

FOREIGN PATENT DOCUMENTS

| | | |
|---|---|---|
| JP | 63-027044 | 2/1988 |
| JP | 05-011667 | 2/1993 |
| JP | 11-186486 | 7/1999 |
| JP | 2001-250948 | 9/2001 |
| JP | 2001-339051 | 12/2001 |

* cited by examiner

*Primary Examiner* — Thien F Tran
(74) *Attorney, Agent, or Firm* — Nixon Peabody LLP; Jeffrey L. Costellia

(57) ABSTRACT

A wiring electrically connected to a terminal to which a high power supply potential is applied and a wiring electrically connected to a terminal to which a low power supply potential is applied are formed adjacent to each other and are formed so as to surround the integrated circuit. Thus, wiring resistance can be added between the terminals and the integrated circuit and capacitance can be added between the two wirings. Even if overvoltage is applied to the terminals due to ESD or the like, the energy of the overvoltage is consumed by the wiring resistance and the added capacitor, so that damage of the integrated circuit can be suppressed.

25 Claims, 25 Drawing Sheets

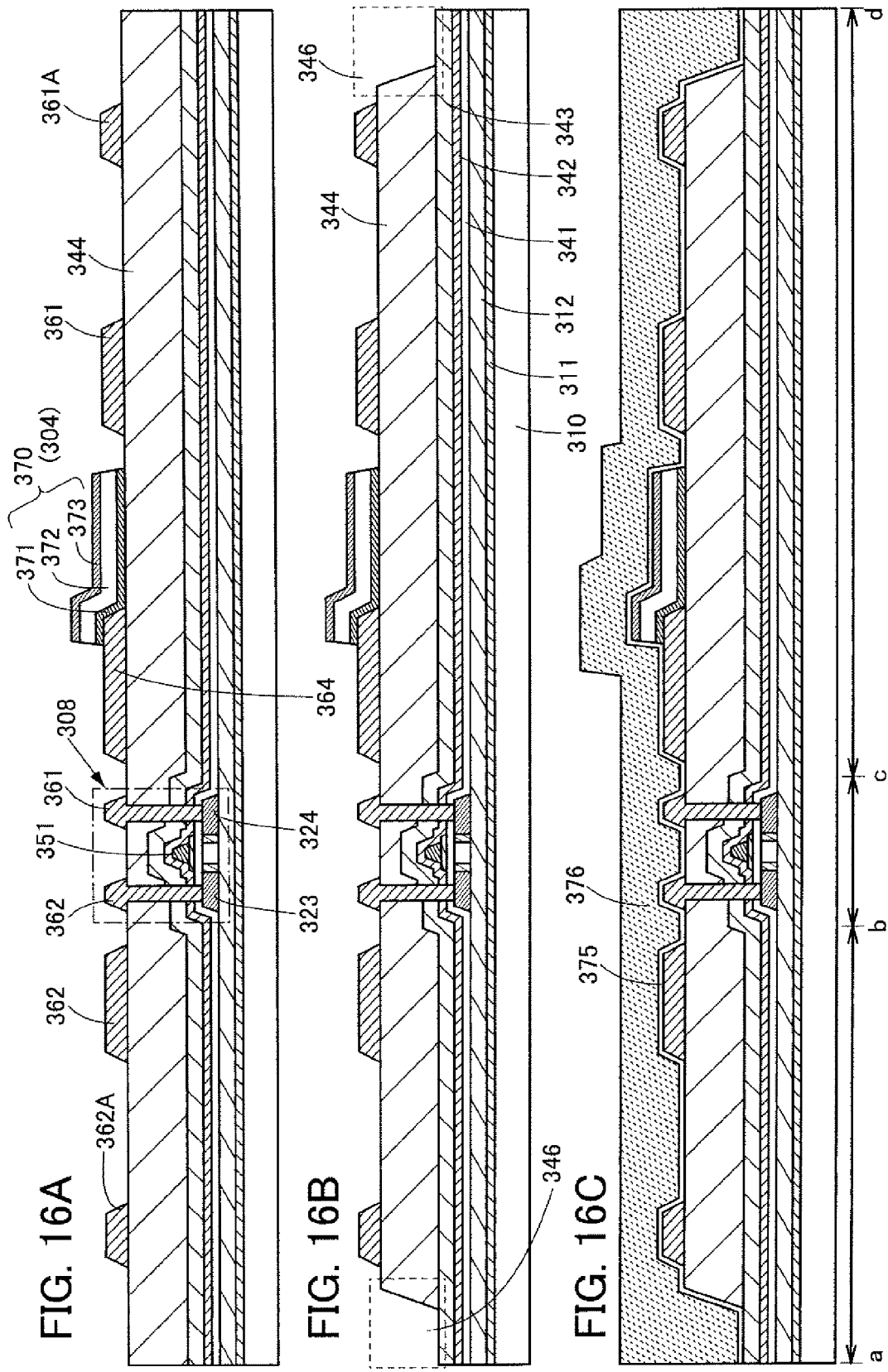

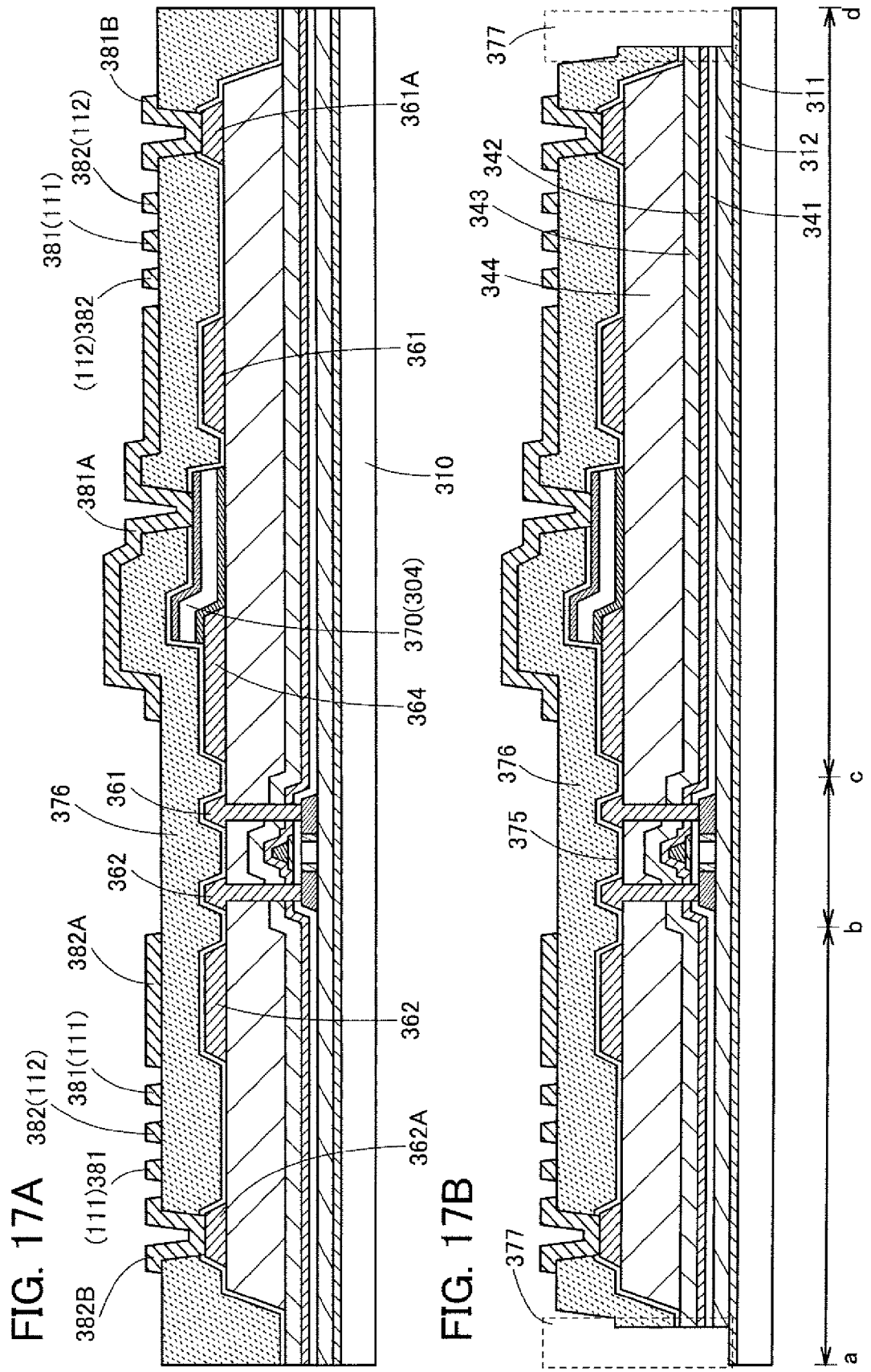

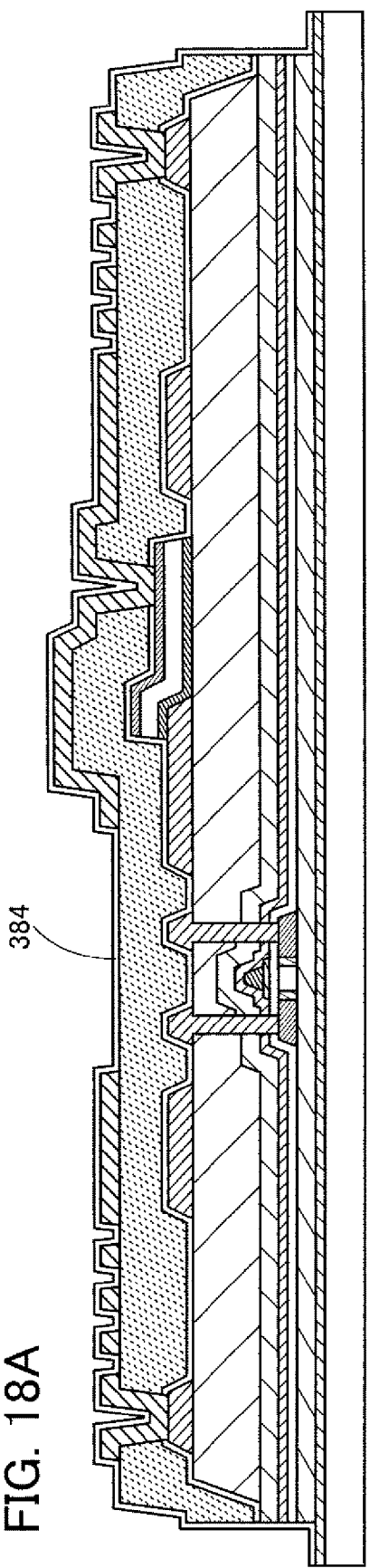
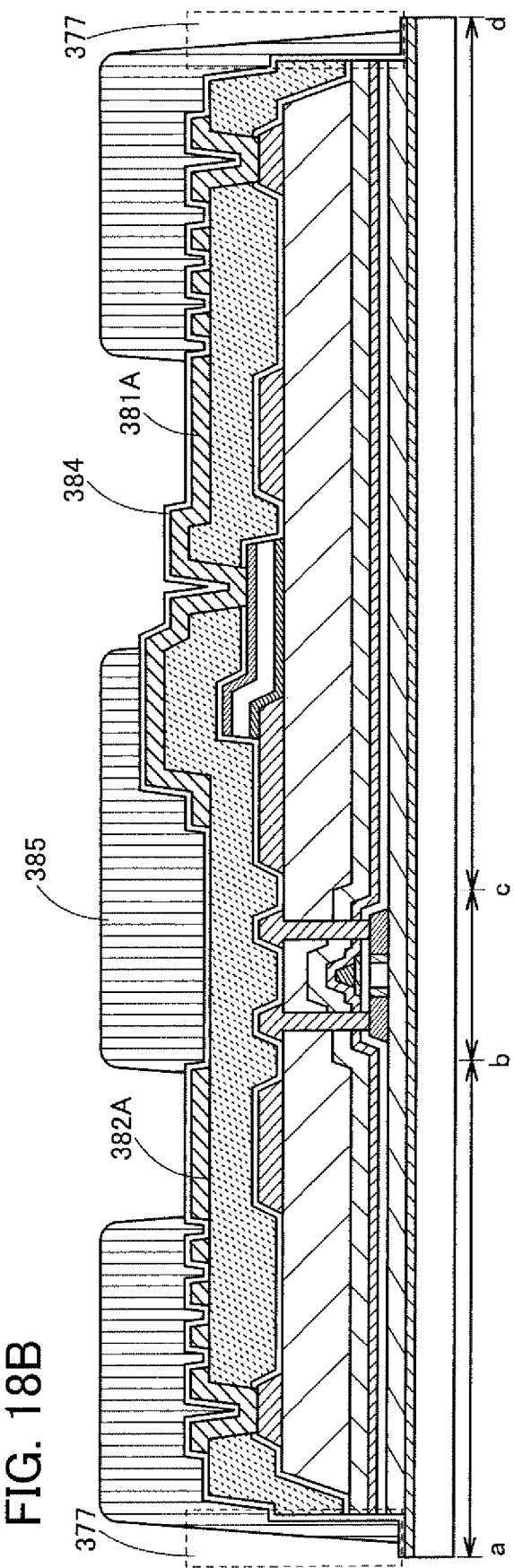
FIG. 18A
FIG. 18B

FIG. 24B
FIG. 24A
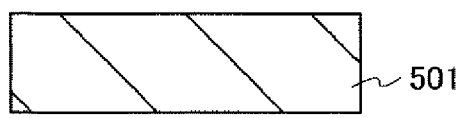
FIG. 24C
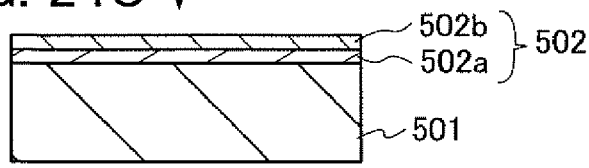
FIG. 24D
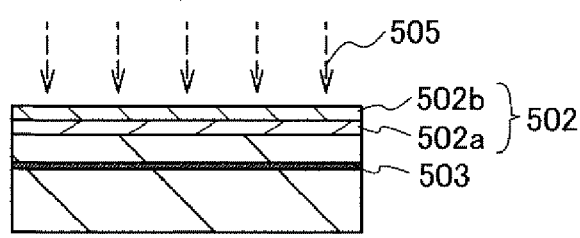
FIG. 24E
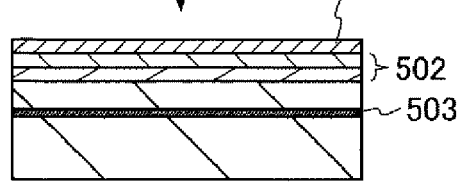
FIG. 24F
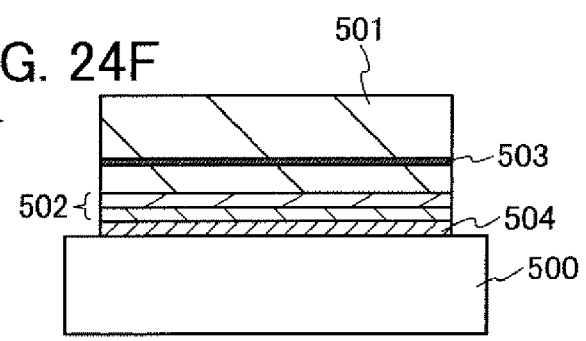
FIG. 24G
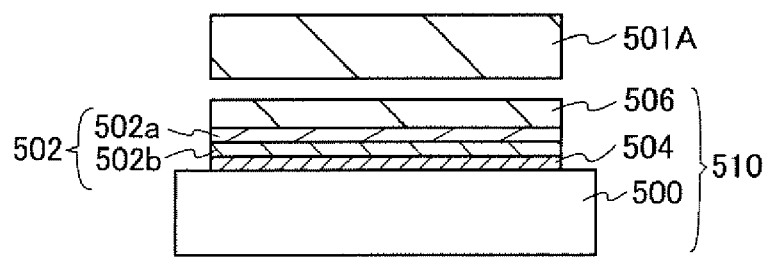

SEMICONDUCTOR DEVICE

BACKGROUND OF THE INVENTION

1. Field of the Invention

The present invention relates to a semiconductor device including an integrated circuit.

2. Description of the Related Art

One of major causes of defects in integrated circuits is damage of semiconductor elements, electrodes, or the like due to electrostatic discharge (ESD). Thus, in order to prevent damage of an integrated circuit due to ESD, a protection circuit is inserted between a power supply terminal and a connection terminal for connection to an external circuit, and the integrated circuit. A protection circuit refers to a circuit for preventing the supply of overvoltage or overcurrent generated due to ESD to an integrated circuit. Typical examples of elements used for protection circuits are resistors, capacitors, diodes, and the like (see Reference 1: Japanese Published Patent Application No. 2001-339051 and Reference 2: Japanese Published Patent Application No. S63-027044).

For example, Reference 1 discloses a technique by which a resistor is formed by inserting a polysilicon film between two adjacent input-output terminals and a capacitor is formed by overlapping one of the input-output terminals and an end portion of the polysilicon film with a gate insulating film interposed therebetween. Further, Reference 1 discloses a technique by which a diode formed using a polysilicon film is inserted between two adjacent input-output terminals, and a capacitor is formed by overlapping one of the input-output terminals and an end portion of the polysilicon film.

In Reference 2, a wiring formed using a polycrystalline silicon film is inserted between a bonding pad and a transistor in a first stage of an internal circuit as a resistor. In Reference 2, in order to prevent short-circuit between the polycrystalline silicon film and a semiconductor substrate due to ESD, a conductive layer which is in an electrically floating state is provided between the polycrystalline silicon film and the semiconductor substrate.

SUMMARY OF THE INVENTION

The higher the integration level of an integrated circuit becomes, the shorter the distance between terminals becomes. Thus, in the case of using wirings as resistors as in References 1 and 2, it is difficult to increase the resistance values of the wirings. Therefore, an advantageous effect of lowering overvoltage generated due to ESD by resistors cannot be sufficiently obtained.

In view of the foregoing problems, it is an object of an embodiment of the present invention to suppress damage of an integrated circuit due to ESD without hampering the high integration of the integrated circuit.

A semiconductor device according to an embodiment of the present invention includes a dielectric; a first wiring to which a first power supply potential is applied; a second wiring which is formed adjacent to the first wiring with the dielectric interposed therebetween and to which a second power supply potential is applied; and an integrated circuit which includes a plurality of semiconductor elements, is electrically connected to the first wiring and the second wiring, and is surrounded by the first wiring and the second wiring.

In the semiconductor device according to the above embodiment, the first wiring and the second wiring may overlap with at least one semiconductor film or conductive film which is in an electrically floating state with a different dielectric interposed therebetween.

A semiconductor device according to an embodiment of the present invention includes a first wiring to which a first power supply potential is applied; a second wiring to which a second power supply potential is applied; a first insulating film; a second insulating film formed over the first insulating film; and an integrated circuit which includes a plurality of semiconductor elements. The first wiring includes a first conductive film formed over the first insulating film. The second wiring includes a second conductive film formed over the first insulating film, and the second conductive film is adjacent to the first conductive film with the second insulating film interposed therebetween. The integrated circuit is surrounded by the first conductive film and the second conductive film, and the first power supply potential and the second power supply potential are applied to the integrated circuit through the first conductive film and the second conductive film.

The semiconductor device according to the above embodiment may include at least one semiconductor film or a third conductive film which overlaps with the first conductive film and the second conductive film with the first insulating film interposed therebetween and is in an electrically floating state.

A semiconductor device according to an embodiment of the present invention includes a first wiring to which a first power supply potential is applied; a second wiring to which a second power supply potential is applied; a first insulating film; a second insulating film formed over the first insulating film; a third insulating film formed over the second insulating film; and an integrated circuit which includes a plurality of semiconductor elements. The first wiring includes a first conductive film formed over the first insulating film. The second wiring includes a second conductive film formed over the first insulating film, and the second conductive film is adjacent to the first conductive film with the second insulating film interposed therebetween. The first wiring further includes a third conductive film formed over the first conductive film and the second conductive film with the second insulating film interposed therebetween. The second wiring further includes a fourth conductive film formed over the first conductive film and the second conductive film with the second conductive film interposed therebetween, and the fourth conductive film is adjacent to the third conductive film with the third insulating film interposed therebetween. The integrated circuit is surrounded by the first to fourth conductive films, and to which the first power supply potential and the second power supply potential are applied through the first conductive film and the third conductive film, and the second conductive film and the fourth conductive film, respectively.

The semiconductor device according to the above embodiment may include at least one semiconductor film or a fifth conductive film which overlaps with the first to fourth conductive films, is covered with the first insulating film, and is in an electrically floating state.

In each embodiment of the above semiconductor devices of the present invention, damage of an integrated circuit due to ESD can be suppressed without hampering the high integration of the integrated circuit. Further, in the embodiments of the present invention, damage of an integrated circuit due to ESD can be suppressed without changing the layout of semiconductor elements and wirings which are included in the integrated circuit.

BRIEF DESCRIPTION OF THE DRAWINGS

In the accompanying drawings:

FIGS. 16A to 16C are cross-sectional views illustrating the method for manufacturing a photodetector after the step in FIG. 15D;

FIG. 17A and 17B are cross-sectional views illustrating the method for manufacturing a photodetector after the step in FIG. 16C;

FIGS. 18A and 18B are cross-sectional views illustrating the method for manufacturing a photodetector after the step in FIG. 17B;

FIGS. 24A to 24G are cross-sectional views illustrating a method for manufacturing an SOI substrate according to an embodiment of the present invention.

DETAILED DESCRIPTION OF THE INVENTION

Figure 1A:
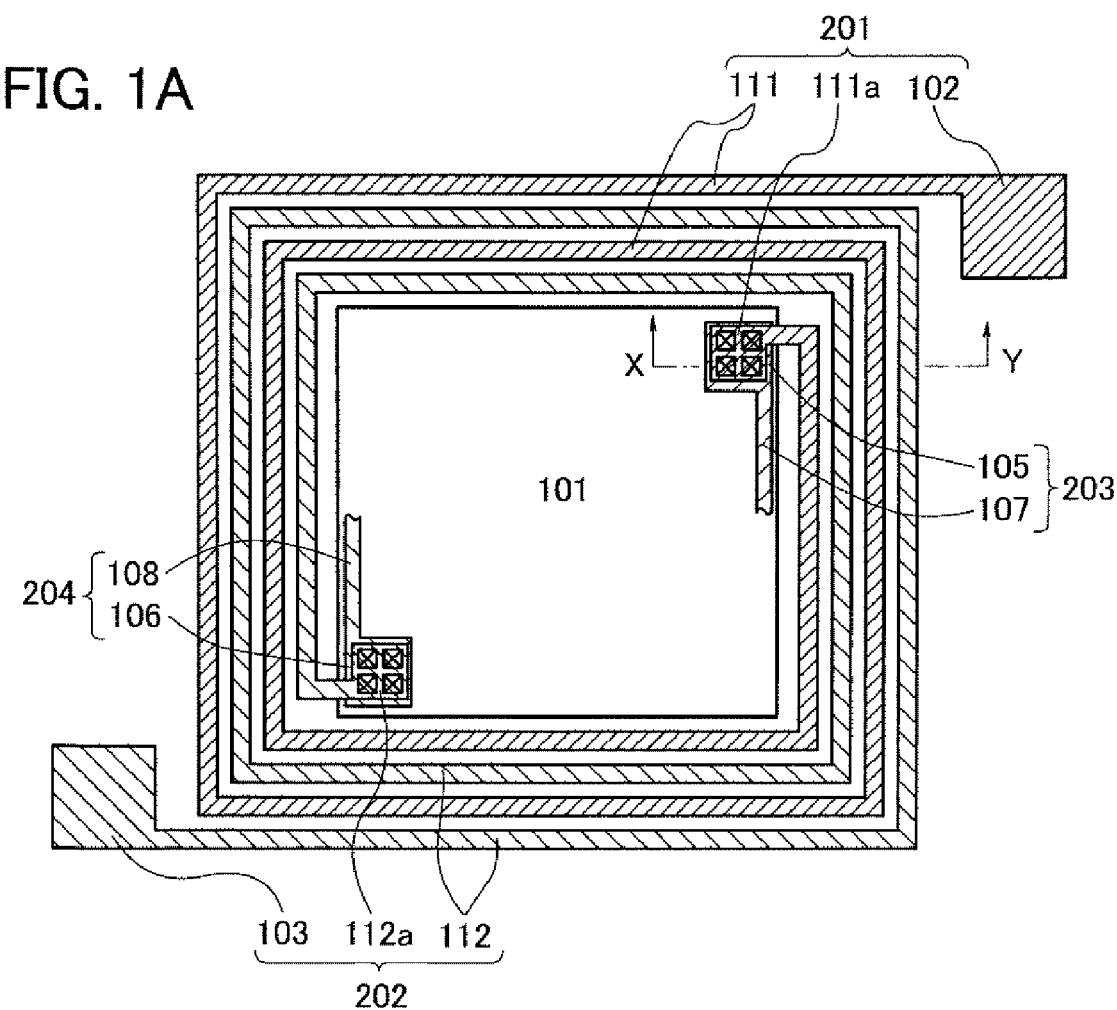
FIG. 1A is a plan view illustrating the layout of a semiconductor device according to an embodiment of the present invention.

Embodiments of the present invention will be described with reference to the drawings. Note that the present invention can be implemented in various different ways and it will be readily appreciated by those skilled in the art that various changes and modifications are possible without departing from the spirit and scope of the present invention. Therefore, the invention disclosed in this specification should not be construed as being limited to the following description of the embodiments. Further, in the drawings used for describing the embodiments, elements denoted by the same reference numerals in different drawings are similar elements. Therefore, description of such elements is not repeated.

Embodiment 1

Figure 1B:
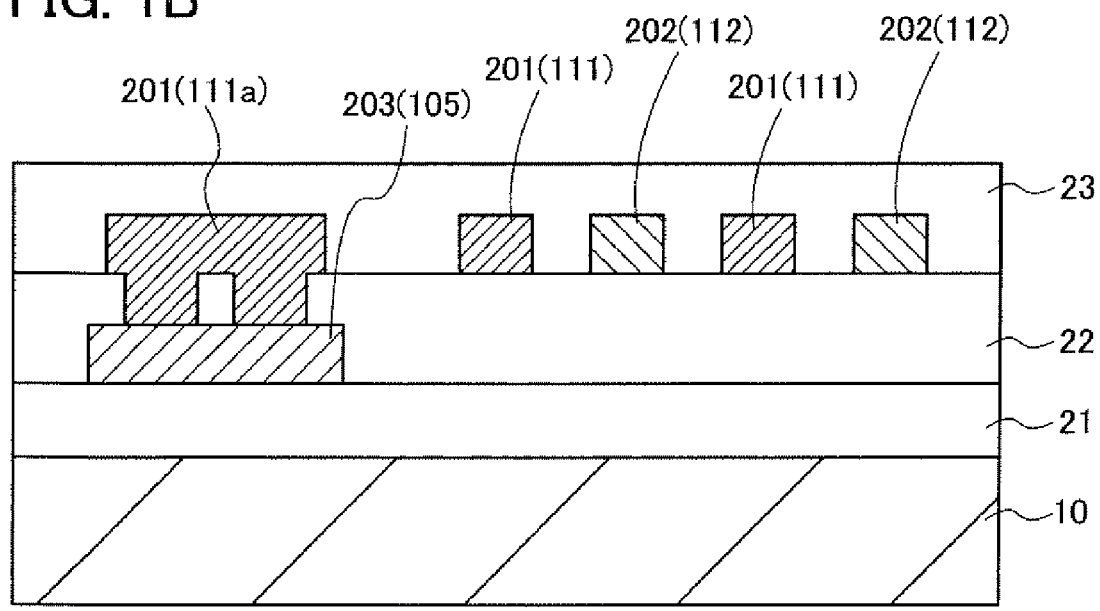
FIG. 1B is a cross-sectional view taken along section line X-Y in FIG. 1A.

The structure of a semiconductor device of this embodiment is described with reference to FIG. 1A and FIG. 1B. FIG. 1A is a plan view illustrating the layout of the semiconductor device of this embodiment. FIG. 1B is a cross-sectional view taken along section line X-Y in FIG. 1A.

As illustrated in FIG. 1A, the semiconductor device includes an integrated circuit 101 having a plurality of semiconductor elements, a first terminal 102 to which a high power supply potential VDD is applied, a second terminal 103 to which a low power supply potential VSS is applied, a first wiring 111 which electrically connects the first terminal 102 and the integrated circuit 101 to each other, and a second wiring 112 which electrically connects the second terminal 103 and the integrated circuit 101 to each other.

The integrated circuit 101 includes a connection portion 105 electrically connected to the first wiring 111 a connection portion 106 electrically connected to the second wiring 112, an internal wiring 107 electrically connected to the connection portion 105, and an internal wiring 108 electrically connected to the connection portion 106. Further, the first wiring 111 includes a connection portion 111a for connection to the connection portion 105, and the second wiring 112 includes a connection portion 112a for connection to the connection portion 106.

The first terminal 102 and the second terminal 103 are terminals for applying power supply potentials to the integrated circuit 101. Here, two power supply potentials are applied to the integrated circuit 101. The higher power supply potential is the high power supply potential VDD. The lower power supply potential is the low power supply potential VSS. For example, the low power supply potential VSS can be a ground potential. The first terminal 102 is a terminal to which the high power supply potential VDD is applied. The second terminal 103 is a terminal to which the low power supply potential VSS is applied. Thus, in the following description, the first terminal 102 is referred to as the VDD terminal 102, and the second terminal 103 is referred to as the VSS terminal 103. Further, the high power supply potential VDD is referred to as the power supply potential VDD, and the low power supply potential VSS is referred to as the power supply potential VSS. With the electrical connection between such elements, the power supply potentials VDD and VSS are applied to the connection portions 105 and 106 in the integrated circuit 101 through the first wiring 111 and the second wiring 112.

As illustrated in FIG. 1A, the length of the first wiring 111 to which the power supply potential VDD is applied is longer than the distance between the VDD terminal 102 and the connection portion 105. The same can be said for the second wiring 112 to which the power supply potential VSS is applied. The length of the second wiring 112 is longer than the distance between the VSS terminal 103 and the connection portion 106. Thus, resistance can be added to the connection portions 105 and 106 in the integrated circuit. In the example illustrated in FIG. 1A, the first wiring 111 and the second wiring 112 are coiled wirings which are formed so as to surround the integrated circuit 101. Further, as illustrated in FIG. 1A, the first wiring 111 and the second wiring 112 are adjacent to each other Since a dielectric (not illustrated in FIG. 1A) is provided between the first wiring 111 and the second wiring 112, capacitance can be added between the first wiring 111 and the second wiring 112.

Figure 2:
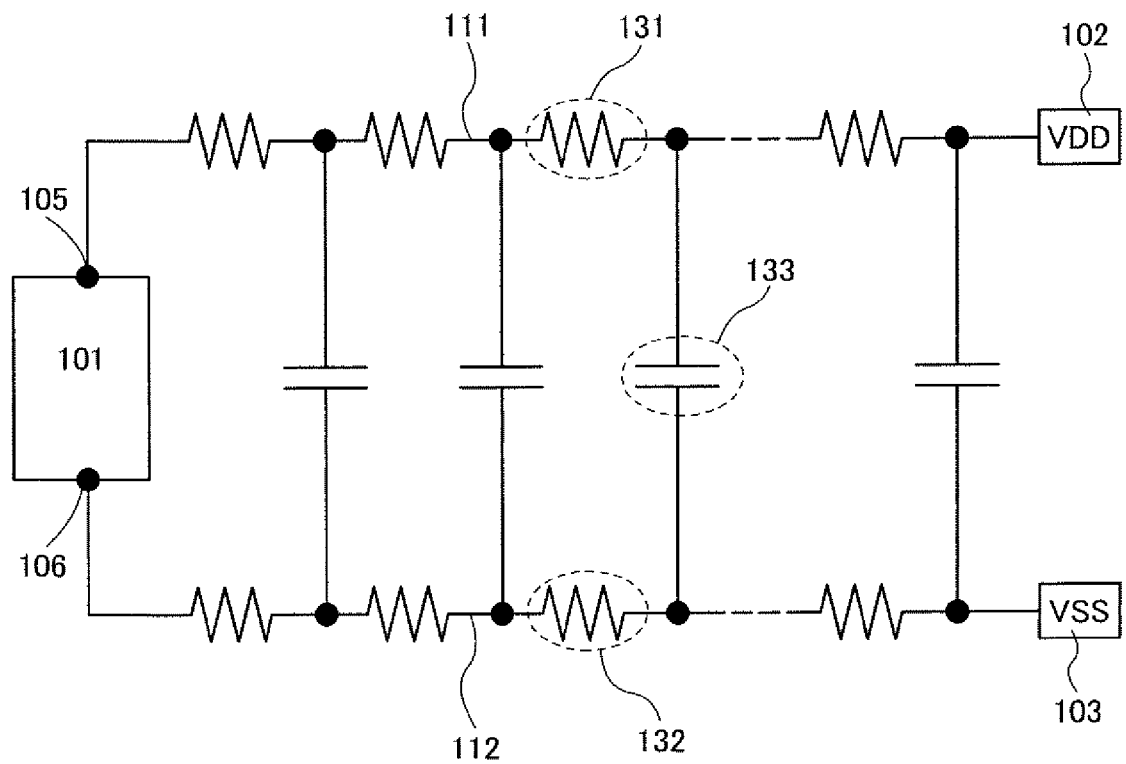
FIG. 2 is a circuit diagram illustrating the electrical functions of a first wiring and a second wiring in FIG. 1A.

FIG. 2 is a circuit diagram illustrating the electrical functions of the first wiring 111 and the second wiring 112. As described above, by forming the first wiring 111 and the second wiring 112 longer, the wiring resistance of the first wiring 111 and the second wiring 112 is increased. With such a structure, a plurality of resistors 131 which are connected in series are inserted between the VDD terminal 102 and the connection portion 105 and a plurality of resistors 132 which are connected in series are inserted between the VSS terminal 103 and the connection portion 106, as illustrated in FIG. 2. Further, by forming the first wiring 111 and the second wiring 112 adjacent to each other with the dielectric interposed therebetween, capacitors 133 are inserted between the first wiring 111 and the second wiring 112. Therefore, when overvoltage is applied or overcurrent flows through the first wiring 111 or the second wiring 112 due to ESD or the like, the energy of the overvoltage or overcurrent is consumed by the resistor 131, the resistor 132, and the capacitor 133, so that the probability of damage of the semiconductor elements in the integrated circuit 101 can be reduced.

By forming the first wiring 111 and the second wiring 112 so as to surround the integrated circuit 101, the first wiring 111 and the second wiring 112 can be formed longer without hampering the high integration of the integrated circuit 101 and without requiring design changes in the layout of the semiconductor elements, the wirings, and the like included in the integrated circuit 101. That is, according to this embodiment, damage of the integrated circuit 101 due to ESD can be suppressed without hampering the high integration of the integrated circuit 101 and without changing the layout of the integrated circuit 101.

As illustrated in FIG. 1A, in this embodiment, the VDD terminal 102 and the first wiring 111 are formed using one conductive film 201, and the VSS terminal 103 and the second wiring 112 are formed using one conductive film 202. In addition, the connection portion 105 and the internal wiring 107 are formed using one conductive film 203, and the connection portion 106 and the internal wiring 108 are formed using one conductive film 204. Note that the VDD terminal 102 and the VSS terminal 103 can be formed using conductive films which are different from the conductive films 201 and 202. Further, the connection portions 105 and 106 can be formed using conductive films which are different from the conductive films 203 and 204.

Furthermore, as illustrated in FIG. 1B, the semiconductor device includes a substrate 10. The integrated circuit 101 is formed over the substrate 10. Note that in the case where the substrate 10 is a semiconductor substrate such as a silicon wafer, part of the substrate 10 is included in a semiconductor layer of the semiconductor element, the internal wiring, or the like of the integrated circuit 101. A top surface of the substrate 10 is covered with an insulating film 21. Note that a different film such as a semiconductor film or a conductive film may be formed between the substrate 10 and the insulating film 21.

The conductive film 203 is formed over the insulating film 21. Although not illustrated in FIG. 1B, the conductive film 204 is also formed over the insulating film 21 in a manner similar to that of the conductive film 203. An insulating film 22 is formed so as to cover the conductive films 203 and 204. The conductive films 201 and 202 are formed over the insulating film 22.

The insulating film 22 is provided with at least one opening which reaches part of the connection portion 105 of the conductive film 203. Through the opening, the conductive film 203 (the connection portion 105) and the conductive film 201 (the connection portion 111a of the first wiring 111) are electrically connected to each other. In addition, the insulating film 22 is provided with at least one opening which reaches part of the connection portion 106 of the conductive film 204. Through the opening, the conductive film 204 (the connection portion 106) and the conductive film 202 (the connection portion 112a of the second wiring 112) are electrically connected to each other.

An insulating film 23 is formed so as to cover the conductive film 201 and the conductive film 202. The insulating film 23 serves as an insulating film (a dielectric) for electrically insulating the conductive film 201 and the conductive film 202 from each other. As illustrated in FIG. 1B, since the conductive film 201 and the conductive film 202 are adjacent to each other with the insulating film 23 interposed therebetween, the conductive film 201 and the conductive film 202 are capacitively coupled. That is, the insulating film 23 is used for a dielectric of the capacitor 133 added between the first wiring 111 and the second wiring 112. Note that in the example of FIG. 1B, in order to apply the power supply potentials VDD and VSS to the VDD terminal 102 and the VSS terminal 103, at least one opening which reaches the VDD terminal 102 and at least one opening which reaches the VSS terminal 103 are formed in the insulating film 23.

A substrate such as a semiconductor substrate, a glass substrate, a quartz substrate, a sapphire substrate, a ceramic substrate, a stainless steel substrate, a metal substrate, a resin substrate, a resin film, or a sheet in which fabric of carbon fiber or glass fiber is impregnated with resin (e.g., a prepreg) can be used for the substrate 10. A silicon wafer obtained by slicing an ingot, an SOI substrate in which a semiconductor layer is formed on a substrate with an insulating layer interposed therebetween, or the like can be used as a semiconductor substrate. A non-alkali glass substrate is preferably used as a glass substrate. As a non-alkali glass substrate, for example, an aluminosilicate glass substrate, an aluminoborosilicate glass substrate, a barium borosilicate glass substrate, or the like can be used.

The insulating films 21 to 23 may each have either a single-layer structure or a layered structure. An insulating film containing silicon or germanium as its component, such as a silicon oxide film, a silicon nitride film, a silicon oxynitride film, a silicon nitride oxide film, a germanium oxide film, a germanium nitride film, a germanium oxynitride film, or a germanium nitride oxide film can be used as each of the insulating films 21 to 23. Alternatively, an insulating film containing a metal oxide such as aluminum oxide, tantalum oxide, or hafnium oxide; an insulating film containing a metal nitride such as aluminum nitride; an insulating film containing a metal oxynitride, such as an aluminum oxynitride film; or an insulating film containing a metal nitride oxide, such as an aluminum nitride oxide film, can be used. Alternatively, an insulating film containing an organic compound can be used. Examples of such an organic compound are acrylic, polyimide, polyamide, polyimide amide, benzocyclobutene, and the like.

Typical examples of a method for forming such insulating films are as follows: chemical vapor deposition (CVD) such as plasma-enhanced CVD (PECVD) or thermal CVD; physical vapor deposition (PVD) such as sputtering or vapor deposition; atomic layer deposition (ALD); a method for forming a film by using a liquid material or a pasty material, such as a spin coating method, a droplet discharge method, or a dip coating method; solid-phase oxidation using plasma, heat, or the like; solid-phase nitriding using plasma, heat, or the like; and the like.

Note that in this specification, oxynitride refers to a substance which contains much oxygen than nitrogen, and nitride oxide refers to a substance which contains much nitrogen than oxygen. For example, silicon oxynitride refers to a substance which contains O, N, Si, and H at concentrations ranging from 50 to 70 atomic percent, 0.5 to 15 atomic percent, 25 to 35 atomic percent, and 0.1 to 10 atomic percent, respectively. Further, for example, silicon nitride oxide refers to a substance which contains O, N, Si, and H at concentrations ranging from 5 to 30 atomic percent, 20 to 55 atomic percent, 25 to 35 atomic percent, and 10 to 25 atomic percent, respectively. Note that the concentrations of the elements are measured using Rutherford backscattering spectrometry (RBS) and hydrogen forward scattering (HFS). Needless to say, the total concentration of the elements does not exceed 100 atomic percent, and the concentrations of O, N, Si, and H fall within the above ranges if the total number of atoms contained in silicon oxynitride or silicon nitride oxide is defined as 100 percent.

Further, the conductive films 201 to 204 may each have a single-layer structure or a layered structure. For example, a film containing a simple metal selected from tantalum, tungsten, titanium, molybdenum, aluminum, chromium, niobium, gold, silver, copper, platinum, or the like as its main component; an alloy film containing the above metal as its main component; a metal compound film of the above metal; or the like can be used as each of the conductive films 201 to 204. Alternatively, a semiconductor film using silicon, germanium, silicon germanium, or the like, to which a donor or an acceptor is added, can be used. For example, as the alloy film, an aluminum-copper alloy film, an aluminum-neodymium alloy film, or the like can be used. As the metal compound film, a metal nitride film such as a titanium nitride film or a tungsten nitride film, or a silicide film such as a nickel silicide film or a cobalt silicide film can be used. Such conductive films can be formed by PVD such as sputtering or vapor deposition; a method for forming a film by using a liquid material or a pasty material, such as a printing method, a droplet discharge method, or a dip coating method; soldering; a plating method; or the like.

The conductive film 201 and the conductive film 202 can be formed using the same conductive film. For example, a conductive film is formed by sputtering or the like so as to cover a top surface of the insulating film 22 and is etched, so that the conductive film 201 and the conductive film 202 can be formed over the insulating film 22. Further, by using this formation method, the conductive film 203 and the conductive film 204 can be formed using the same conductive film formed on a top surface of the insulating film 21.

Here, the VDD terminal 102 is formed using the conductive film 201 used for the first wiring 111; however, the VDD terminal 102 can be formed using a different conductive film. In that case, for example, a conductive film used for the VDD terminal 102 is formed over the insulating film 23 and is electrically connected to the conductive film 201 through the opening formed in the insulating film 23. In a similar manner, the VSS terminal 103 can be formed using a conductive film which is different from the conductive film 202 used for the second wiring 112.

In this embodiment, since the first wiring 111 (the conductive film 201) and the second wiring 112 (the conductive film 202) are provided so as to surround the integrated circuit 101 as illustrated in FIG. 1A, there is no need to change the layout of the integrated circuit 101 and the high integration of the integrated circuit 101 is not hampered. That is, according to this embodiment, damage of the integrated circuit 101 due to ESD can be suppressed without changing the layout of the integrated circuit 101 and without hampering the high integration of the integrated circuit 101. The first wiring 111 (the conductive film 201), the second wiring 112 (the conductive film 202), and the dielectric (the insulating film 23) of this embodiment have extremely broad versatility as protection devices against ESD.

This embodiment can be combined with any of other embodiments as appropriate. For example, the kinds, the formation methods, and the like of the conductive films 201 to 204, the insulating films 21 to 23, and the like can be used for conductive films and insulating films in any of other embodiments.

Embodiment 2

Figure 3A:
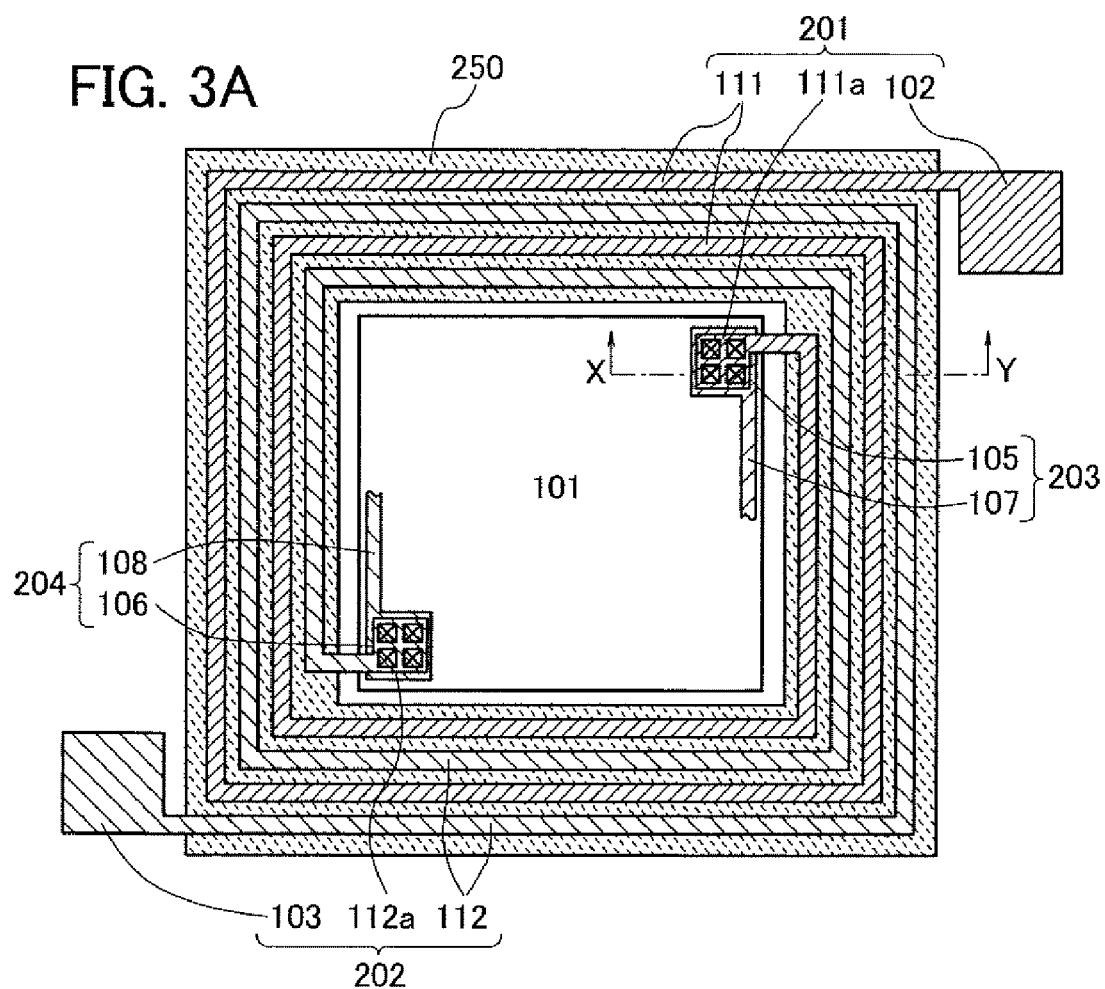
FIG. 3A is a plan view illustrating the layout of a semiconductor device according to an embodiment of the present invention.
Figure 3B:
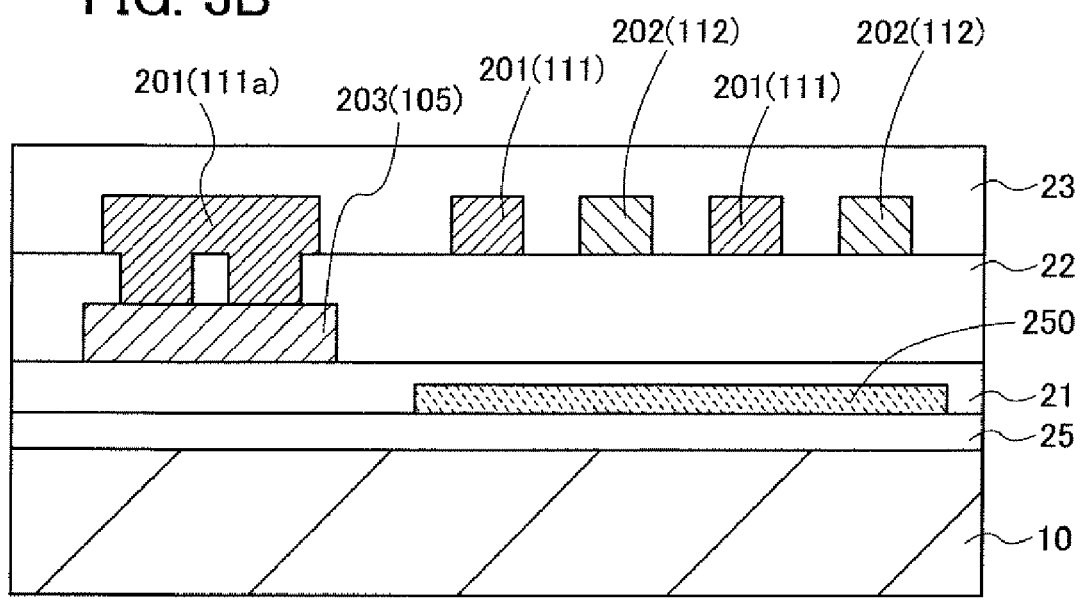
FIG. 3B is a cross-sectional view taken along section line X-Y in FIG. 3A.

The structure of a semiconductor device of this embodiment is described with reference to FIG. 3A and FIG. 3B. FIG. 3A is a plan view illustrating the layout of the semiconductor device of this embodiment. FIG. 3B is a cross-sectional view taken along section line X-Y in FIG. 3A.

As illustrated in FIG. 3A, a semiconductor film 250 which overlaps with the first wiring 111 to which the power supply potential VDD is applied and the second wiring 112 to which the power supply potential VSS is applied is provided in the semiconductor device of this embodiment. The semiconductor film 250 is formed so as to surround the integrated circuit 101 in a manner similar to those of the conductive films 201 and 202. Here, the shape of the semiconductor film 250 is a quadrangle where an opening is formed in a portion overlapping with the integrated circuit 101.

As illustrated in FIG. 3B, the semiconductor film 250 is formed between the substrate 10 and the insulating film 21. The semiconductor film 250 is formed over an insulating film 25 covering the top surface of the substrate 10 and is covered with the insulating films 21 and 22. In addition, the semiconductor film 250 is not electrically connected to any wiring, terminal, or the like of the semiconductor device and is in an electrically floating state.

That is, the first wiring 111 (the conductive film 201) and the second wiring 112 (the conductive film 202) overlap with the semiconductor film 250 which is in an electrically floating state with the insulating films 21 and 22 interposed therebetween. With such a structure, parasitic capacitance is further added between the first wiring 111 (the conductive film 201)

and the second wiring 112 (the conductive film 202). Thus, in the case where overvoltage is applied or overcurrent flows to the VDD terminal 102 or the VSS terminal 103 due to ESD or the like, the energy of the overvoltage or overcurrent is also consumed by the parasitic capacitance, so that the probability of damage of the integrated circuit 101 can be further reduced.

The semiconductor film 250 may have either a single-layer structure or a layered structure. A semiconductor film containing an element belonging to Group 14, such as a silicon film, a germanium film, a silicon germanium film, or a silicon carbide film; a compound semiconductor film such as a GaAs film, an InP film, or a GaN film; an oxide semiconductor such as zinc oxide or tin oxide; or the like can be used for the semiconductor film 250. The semiconductor film 250 may be either an amorphous film or a crystalline (e.g., single crystal, polycrystalline, or microcrystalline) film. In addition, the semiconductor film 250 may contain an impurity element which serves as a donor or an acceptor, such as phosphorus, boron, or arsenic. That is, any of an i-type (intrinsic) semiconductor film, an n-type semiconductor film, and a p-type semiconductor film can be used as the semiconductor film 250. Further, a region having a different conductivity type may be partly formed in the semiconductor film 250. For example, a p-type region may be partly provided in an n-type silicon film.

Figure 4:
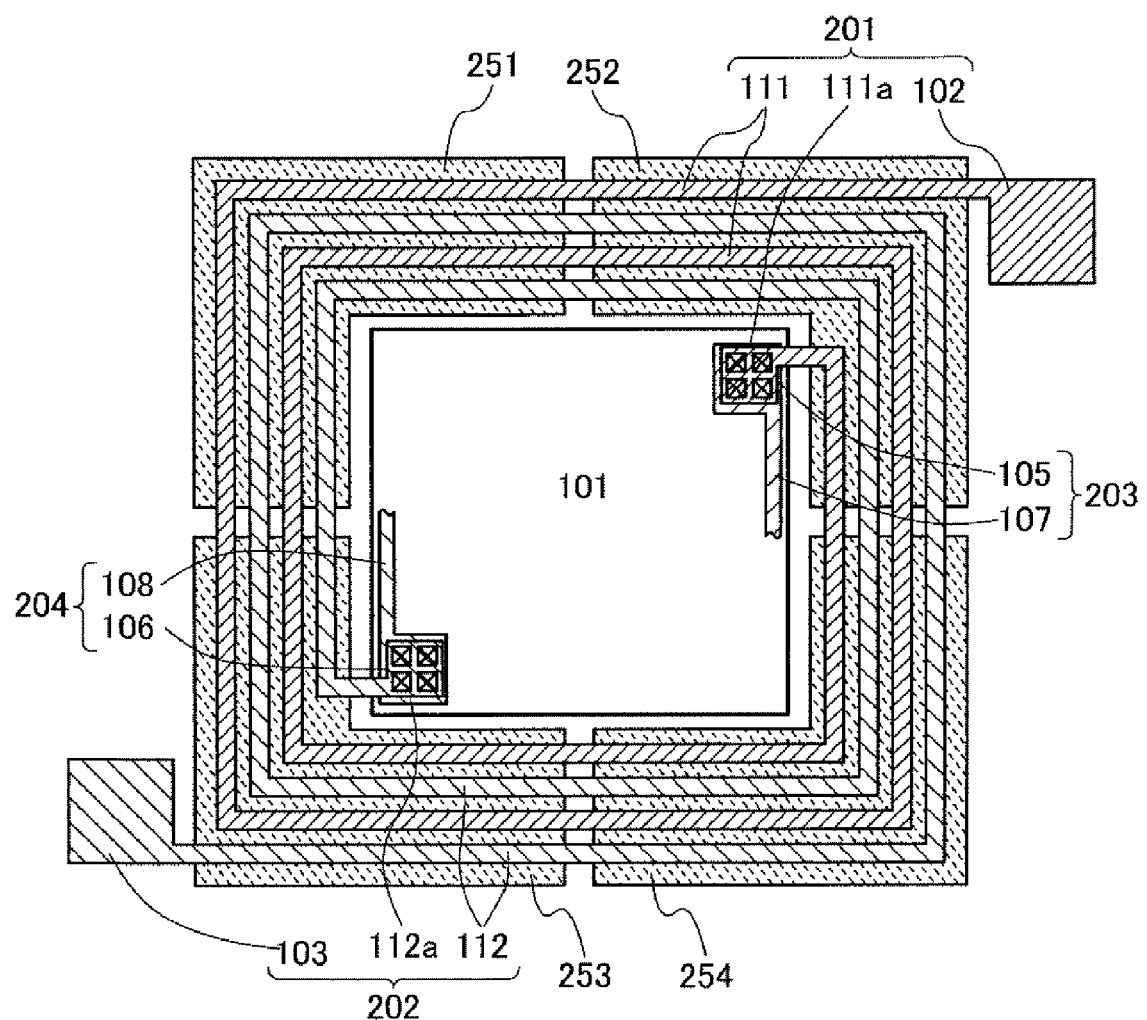
FIG. 4 is a plan view illustrating the layout of a semiconductor device according to an embodiment of the present invention.

Further, as illustrated in FIG. 4, a plurality of semiconductor films can be provided so as to overlap with the first wiring 111 and the second wiring 112. FIG. 4 is a plan view illustrating the layout of a semiconductor device where a plurality of semiconductor films which are in an electrically floating state are provided. Here, four semiconductor films 251 to 254 are provided so as to overlap with the first wiring 111 and the second wiring 112. In a manner similar to that of the semiconductor film 250 in FIG. 3B, each of the semiconductor films 251 to 254 is formed over the insulating film 25 and overlaps with the conductive films 201 and 202 with the insulating films 21 and 22 interposed therebetween.

Furthermore, in this embodiment, instead of the semiconductor films 250 to 254, a conductive film which is in an electrically floating state may be provided. As the conductive film, a conductive film which is similar to the conductive films 201 to 204 can be used.

This embodiment can be combined with any of other embodiments as appropriate.

Embodiment 3

Figure 5A:
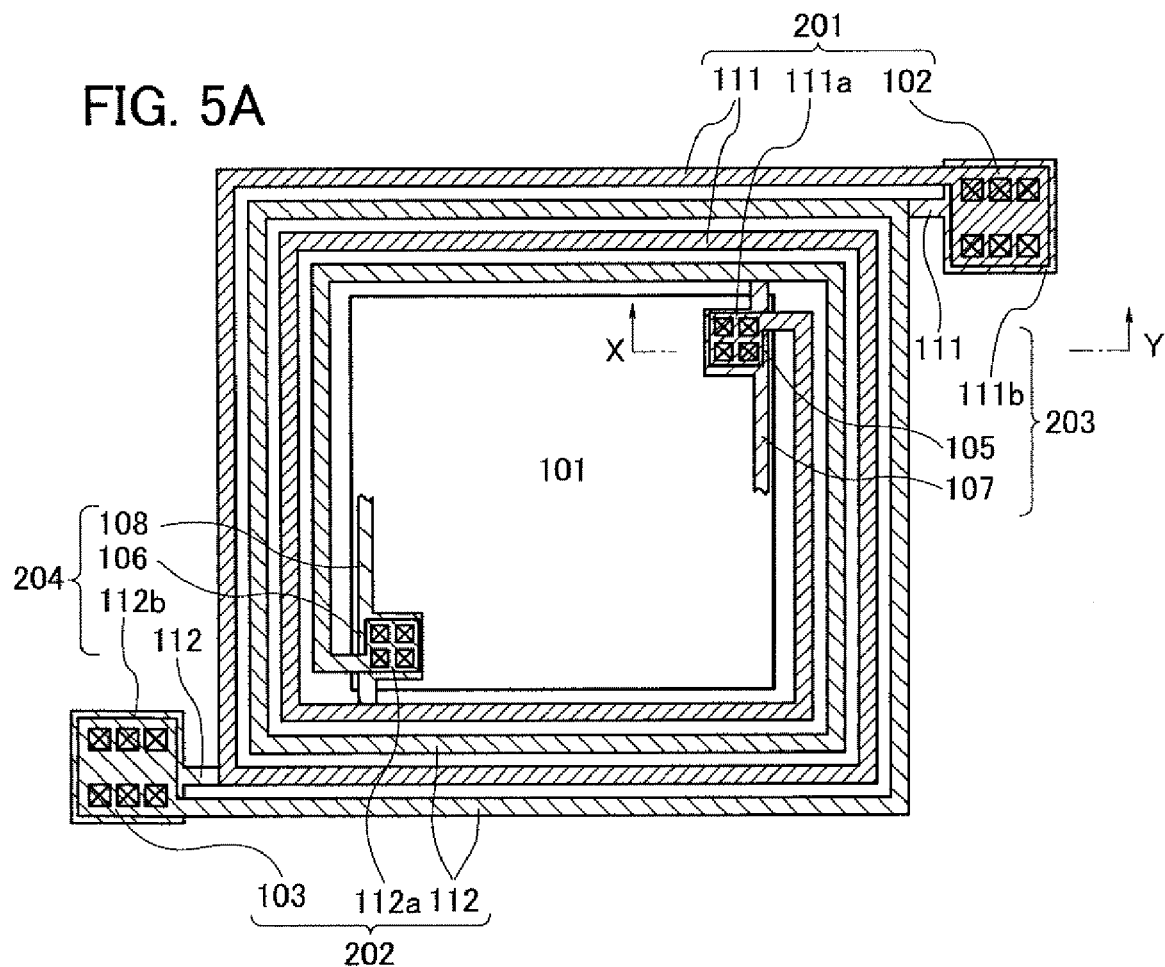
FIG. 5A is a plan view illustrating the layout of a semiconductor device according to an embodiment of the present invention.
Figure 5B:
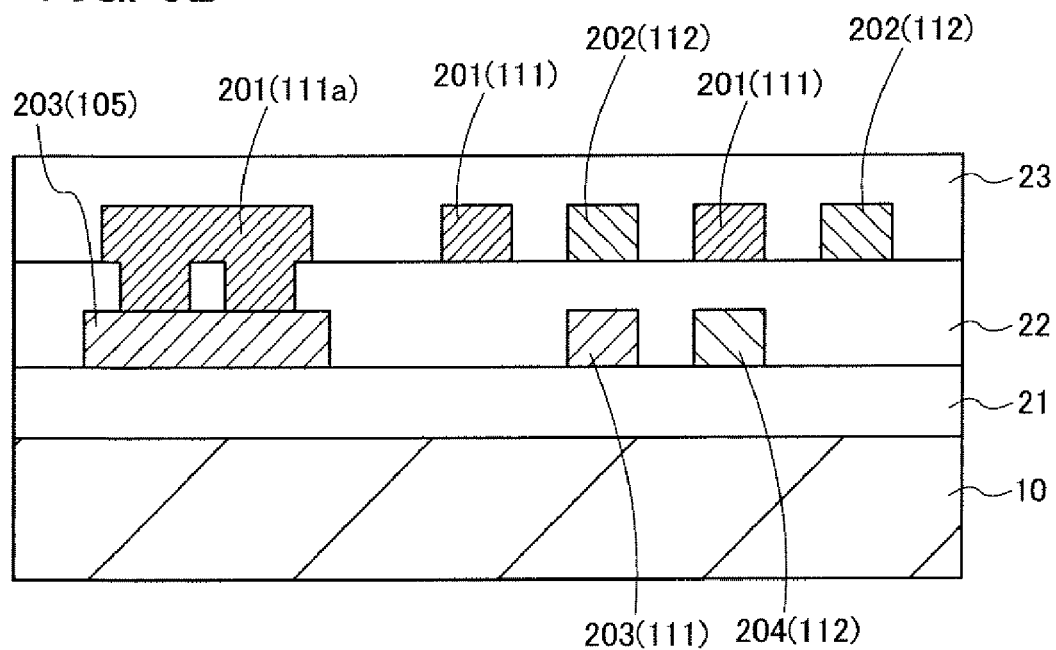
FIG. 5B is a cross-sectional view taken along section line X-Y in FIG. 5A.
Figure 6A:
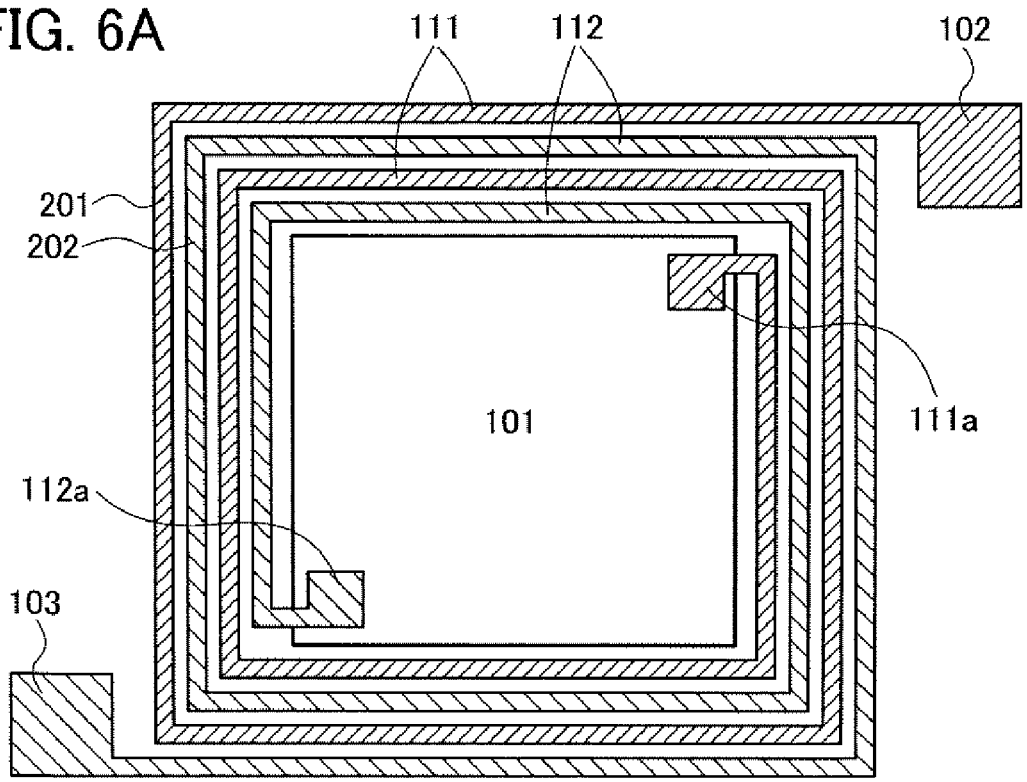
FIG. 6A is a plan view illustrating the layout of conductive films (second layers) used for a first wiring and a second wiring in FIG. 5A.
Figure 6B:
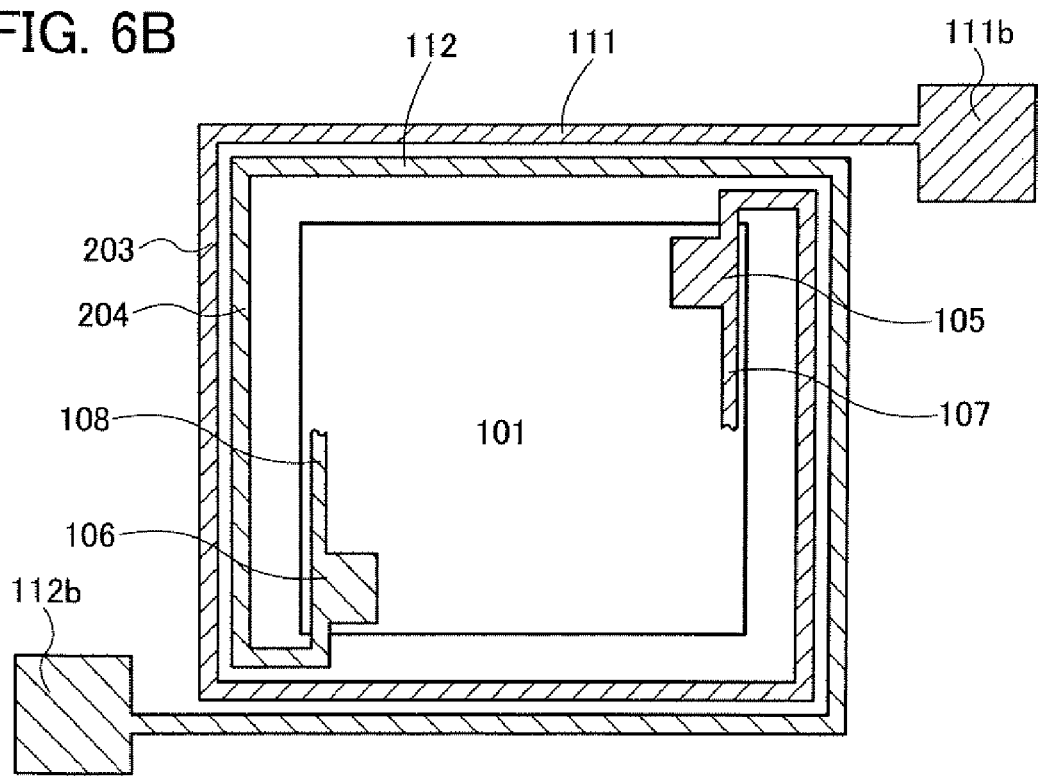
FIG. 6B is a plan view illustrating the layout of conductive films (first layers) used for the first wiring and the second wiring in FIG. 5A.

In this embodiment, an example is illustrated in which each of the first wiring 111 and the second wiring 112 is formed using two conductive films which are stacked with an insulating film interposed therebetween. The structure of a semiconductor device of this embodiment is described with reference to FIG. 5A, FIG. 5B, FIG. 6A, and FIG. 6B. FIG. 5A is a plan view illustrating the layout of the semiconductor device of this embodiment. FIG. 5B is a cross-sectional view taken along section line X-Y in FIG. 5A. In addition, FIG. 6A and FIG. 6B are plan views each illustrating the layout of conductive films used for the first wiring 111 and the second wiring 112. FIG. 6A is a plan view of a second conductive film. FIG. 6B is a plan view of a first conductive film.

As illustrated in FIG. 5A, the first wiring 111 includes the conductive film 201 and the conductive film 203 which is used for the connection portion 105. In addition, the second wiring 112 includes the conductive film 202 and the conductive film 204 which is used for the connection portion 106. As illustrated in FIG. 6A, the layout of the conductive films 201 and 202 are similar to that of FIG. 1A. As illustrated in FIG. 6B, the conductive film 203 includes the first wiring 111 and a connection portion 111b for connection to the VDD terminal 102, in addition to the connection portion 105 and the internal wiring 107. Further, the conductive film 204 includes the second wiring 112 and a connection portion 112b for connection to the VSS terminal 103, in addition to the connection portion 106 and the internal wiring 108.

As illustrated in FIG. 5B, a portion of the first wiring 111 in the conductive film 203 overlaps with a portion of the second wiring 112 in the conductive film 202 with the insulating film 22 interposed therebetween. In addition, a portion of the second wiring 112 in the conductive film 204 overlaps with a portion of the first wiring 111 in the conductive film 201 with the insulating film 22 interposed therebetween. Further, although not illustrated, the connection portion 111b of the conductive film 203 is electrically connected to the VDD terminal 102 through the opening provided in the insulating film 22, and the connection portion 112b of the conductive film 204 is electrically connected to the VSS terminal 103. With such a structure, the first wiring 111 and the second wiring 112 are adjacent to each other with the dielectric (the insulating film 22) interposed therebetween in a direction where the films are stacked. That is, according to this embodiment, the capacitance value of capacitance added between the first wiring 111 and the second wiring 112 can be increased.

Although each of the first wiring 111 and the second wiring 112 is formed using two conductive films which are stacked with an insulating layer (a dielectric) interposed therebetween in this embodiment, each of the first wiring 111 and the second wiring 112 can be formed using three or more conductive films.

This embodiment can be combined with any of other embodiments as appropriate. For example, in combination with Embodiment 2, a single semiconductor film (or conductive film) or a plurality of semiconductor films (or conductive films) which overlap with the first wiring 111 and the second wiring 112 with a dielectric (an insulating film) interposed therebetween and are in an electrically floating state can be formed.

Embodiment 4

Figure 7A:
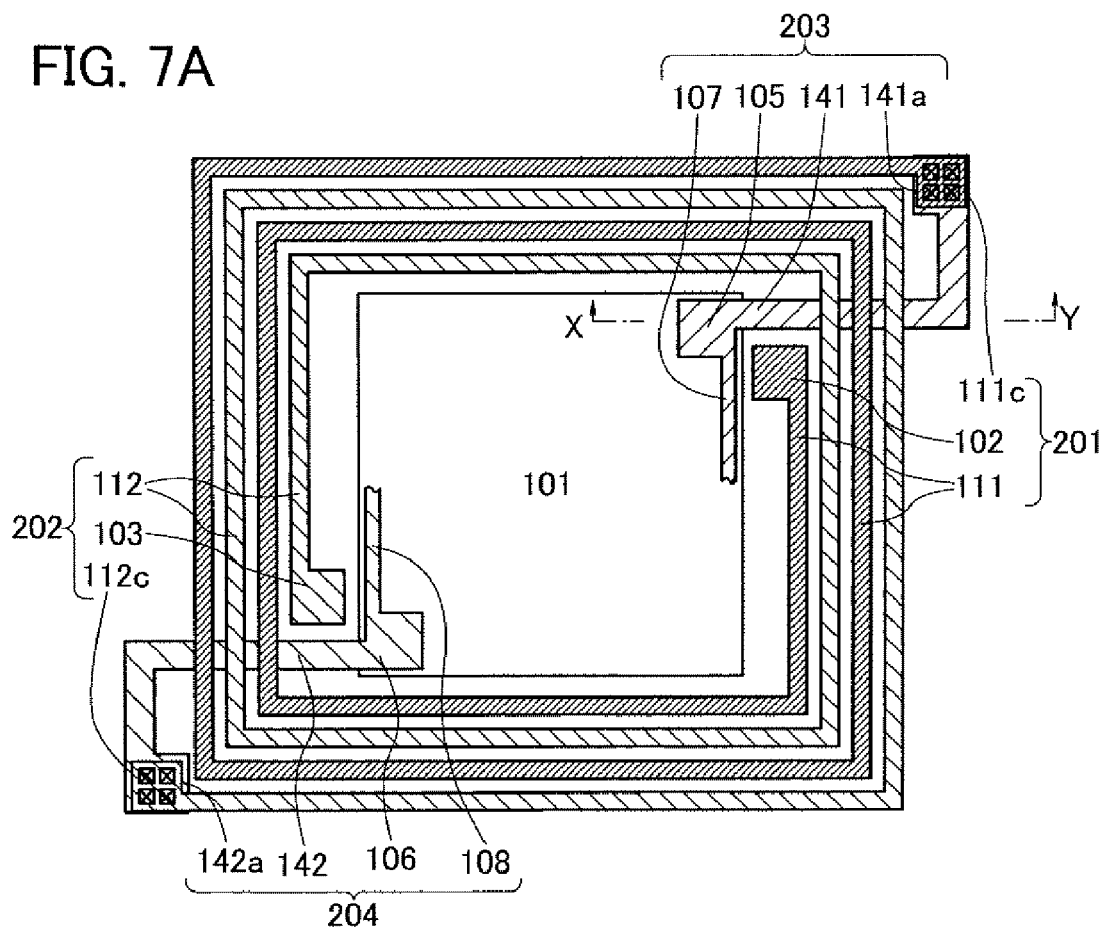
FIG. 7A is a plan view illustrating the layout of a semiconductor device according to an embodiment of the present invention.
Figure 7B:
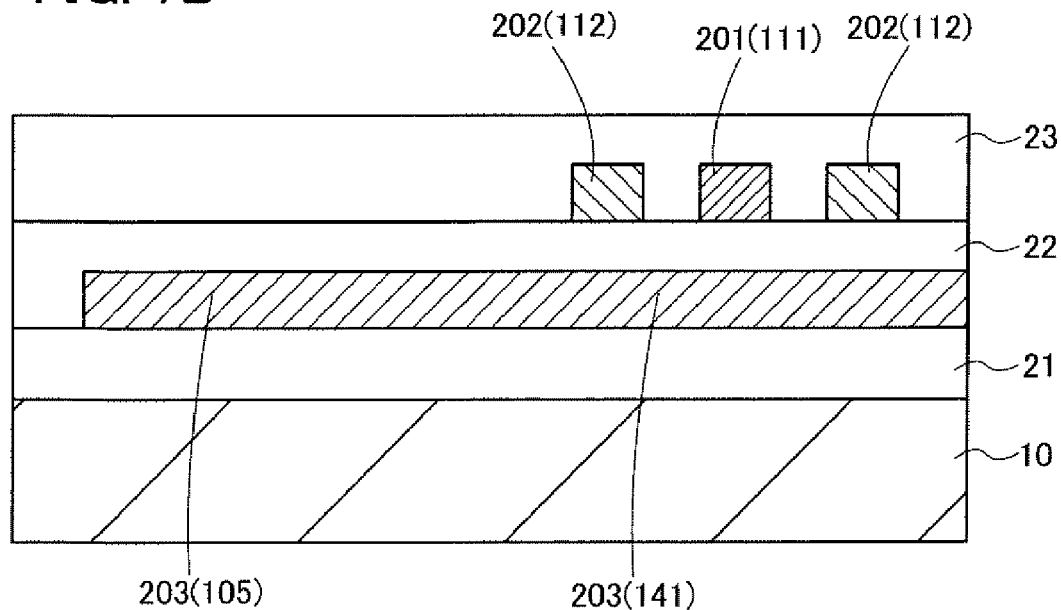
FIG. 7B is a cross-sectional view taken along section line X-Y in FIG. 7A.

In Embodiment 1, as illustrated in FIG. 1A, the first wiring 111 and the second wiring 112 are formed so as to surround the integrated circuit 101 inward taking the VDD terminal 102 and the VSS terminal 103 as starting points; however, the first wiring 111 and the second wiring 112 can be formed so as to surround the integrated circuit 101 outward taking the VDD terminal 102 and the VSS terminal 103 as starting points. In this embodiment, an example is illustrated in which the first wiring 111 and the second wiring 112 are formed so as to surround the integrated circuit 101 outward taking the VDD terminal 102 and the VSS terminal 103 as starting points. FIG. 7A is a plan view illustrating the layout of the semiconductor device of this embodiment. FIG. 7B is a cross-sectional view taken along section line X-Y in FIG. 7A.

As illustrated in FIG. 7A, the first wiring 111 and the second wiring 112 are formed so as to surround the integrated circuit 101 outward taking the VDD terminal 102 and the VSS terminal 103 as starting points. In this embodiment, a wiring 141 for electrically connecting the first wiring 111 to the connection portion 105 of the integrated circuit 101 is formed in the conductive film 203. In a similar manner, a wiring 142 for electrically connecting the second wiring 112 to the connection portion 106 of the integrated circuit 101 is formed in the conductive film 204.

In addition, the first wiring 111 includes a connection portion 111c formed in the conductive film 201, and the wiring 141 includes a connection portion 141a formed in the conductive film 203. As illustrated in FIG. 7B, the connection portion 111c and the connection portion 141a are electrically connected to each other through the opening formed in the insulating film 22. With such a structure, the power supply voltage VDD applied to the VDD terminal 102 is applied to the integrated circuit 101.

Further, the second wiring 112 includes a connection portion 112c formed in the conductive film 202, and the wiring 142 includes a connection portion 142a formed in the conductive film 204. The connection portion 112c and the connection portion 142a are electrically connected to each other through the opening formed in the insulating film 22. With such a structure, the power supply voltage VSS applied to the VSS terminal 103 is applied to the integrated circuit 101.

This embodiment can be combined with any of other embodiments as appropriate. For example, in combination with Embodiment 2, a single semiconductor film (or conductive film) or a plurality of semiconductor films (or conductive films) which overlap with the first wiring 111 and the second wiring 112 with a dielectric (an insulating film) interposed therebetween and are in an electrically floating state can be formed. Alternatively, in combination with Embodiment 3, a plurality of conductive films which overlap with the first wiring 111 and the second wiring 112 with an insulating film interposed therebetween can be formed.

Embodiment 5

Figure 8:
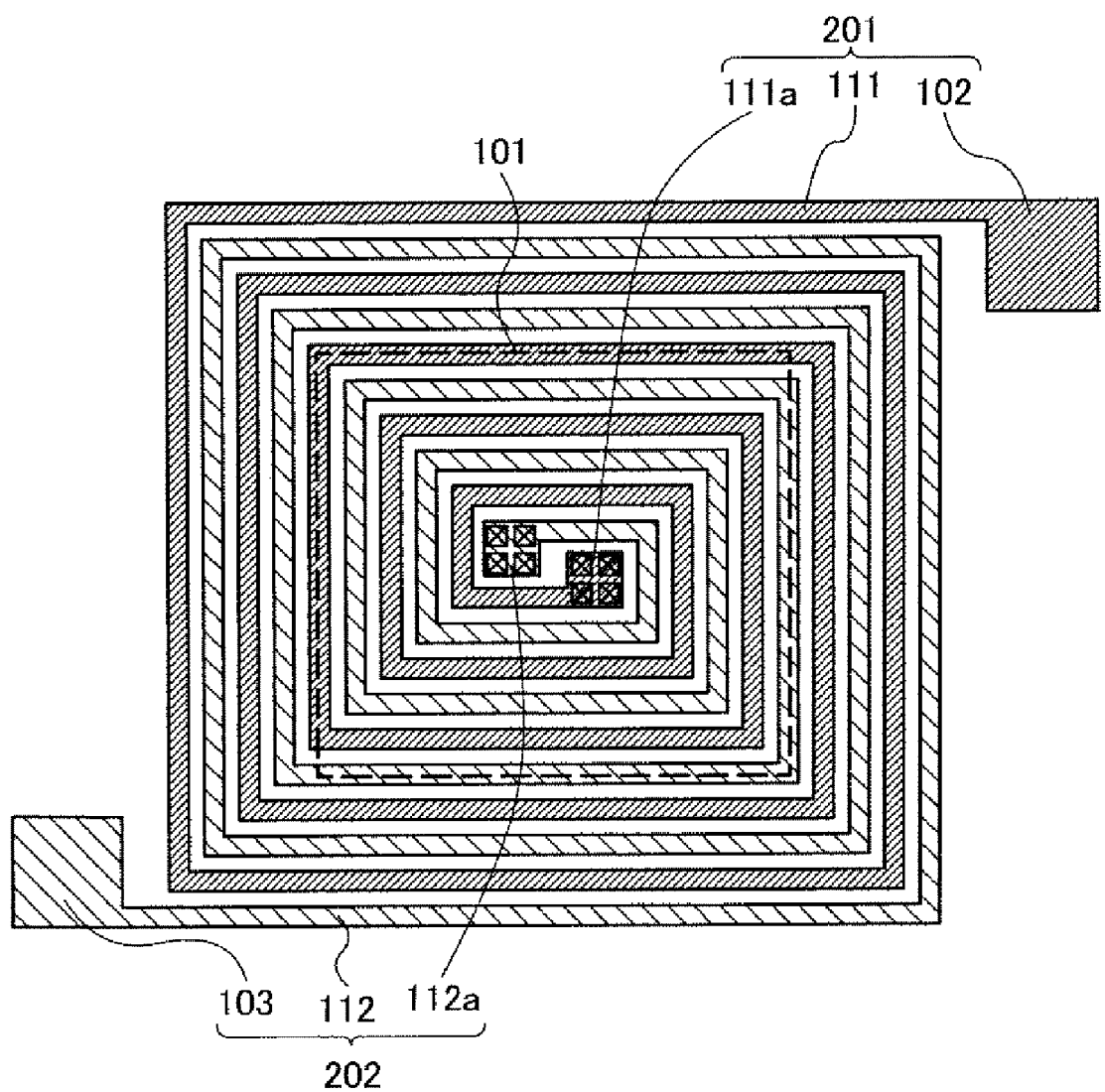
FIG. 8 is a plan view illustrating the layout of conductive films used for a first wiring and a second wiring in FIG. 7A.

In the semiconductor device in FIG. 1A, the first wiring 111 and the second wiring 112 may each have a portion overlapping with the integrated circuit 101. In this embodiment, a semiconductor device which includes the first wiring 111 and the second wiring 112 each having a portion overlapping with the integrated circuit 101 is described. FIG. 8 is a plan view illustrating the layout of the first wiring 111 and the second wiring 112.

As illustrated in FIG. 8, the first wiring 111 and the second wiring 112 are coiled wirings and each have a portion overlapping with the integrated circuit 101. In addition, the first wiring 111 and the second wiring 112 are formed using the conductive film 201 and the conductive film 202 in a manner similar to that of Embodiment 1, and are provided adjacent to each other with a dielectric (an insulating film). interposed therebetween.

Further, the connection portion 111a of the first wiring 111 and the connection portion 112a of the second wiring 112 are formed so as to overlap with the integrated circuit 101. The connection portions 111a and 112a are electrically connected to the connection portions 105 and 106 of the integrated circuit 101 through openings formed in the insulating film.

In this embodiment, the first wiring 111 and the second wiring 112 have electrical functions which are similar to those of the circuit illustrated in FIG. 2. Thus, by providing the first wiring 111 and the second wiring 112 adjacent to each other with the dielectric interposed therebetween, when overvoltage is applied or overcurrent flows to the first wiring 111 or the second wiring 112 due to ESD or the like, the probability of damage of the integrated circuit 101 due to such overvoltage or overcurrent can be reduced.

This embodiment can be combined with any of other embodiments as appropriate. For example, in combination with Embodiment 2, a single semiconductor film (or conductive film) or a plurality of semiconductor films (or conductive films) which overlap with the first wiring 111 and the second wiring 112 with a dielectric (an insulating film) interposed therebetween and are in an electrically floating state can be formed. Alternatively, in combination with Embodiment 3, the first wiring 111 and the second wiring 112 can be formed using a plurality of conductive films which are stacked with an insulating film interposed therebetween.

Embodiment 6

Figure 9:
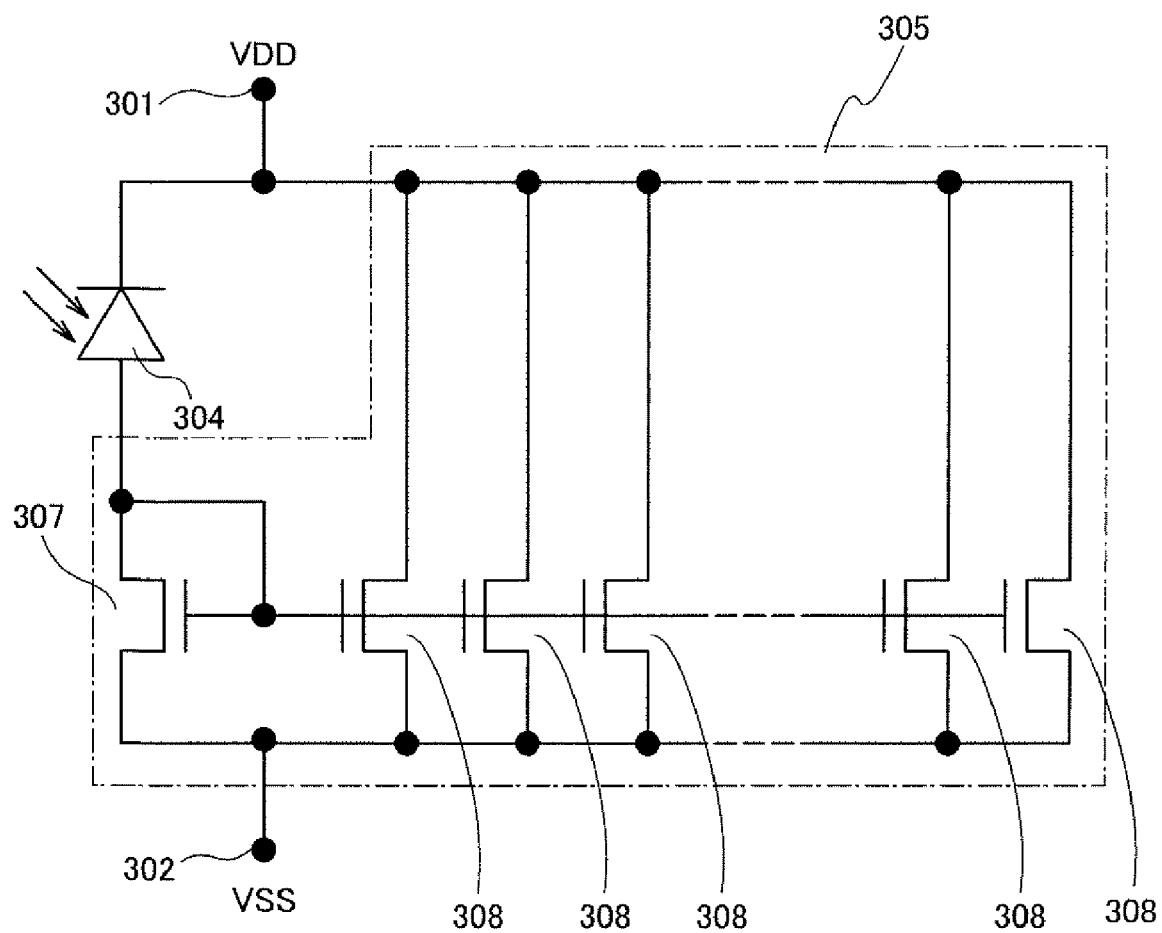
FIG. 9 is a circuit diagram of an integrated circuit in a photodetector according to an embodiment of the present invention.
Figure 10:
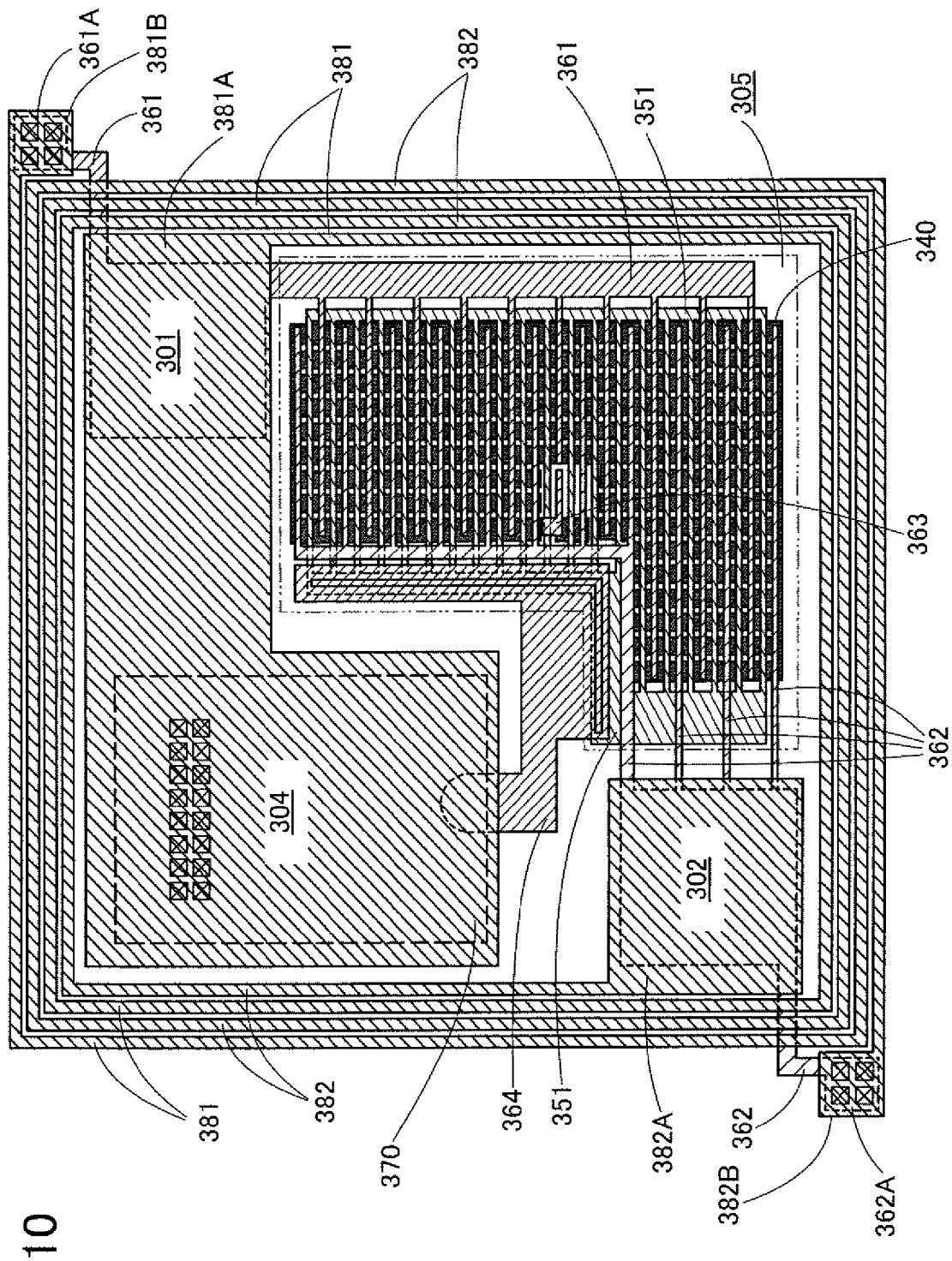
FIG. 10 is a plan view illustrating the layout of the photodetector in FIG. 9.
Figure 11:
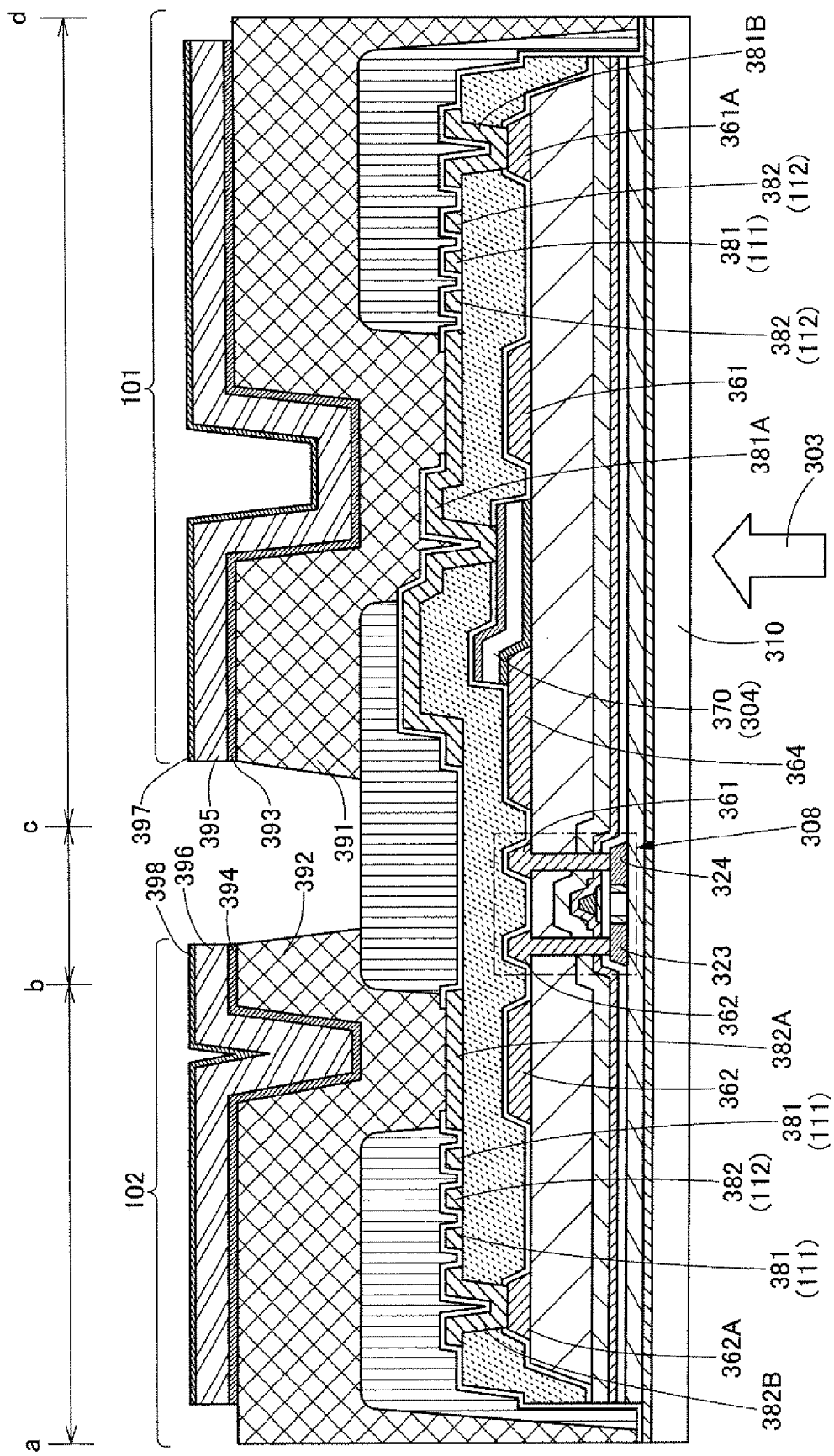
FIG. 11 is a cross-sectional view illustrating the layered structure of a film included in the photodetector in FIG. 9.

In this embodiment, a photodetector is described as a specific example of a semiconductor device. First, the structure of the photodetector is described with reference to FIG. 9, FIG. 10, and FIG. 11. FIG. 9 is a circuit diagram of a photodetector of this embodiment. FIG. 10 is a plan view illustrating the layout of the photodetector. FIG. 11 is a cross-sectional view illustrating the layered structure of the photodetector.

As illustrated in FIG. 9, an integrated circuit of this embodiment includes a connection portion 301 to which the power supply voltage VDD is applied, a connection portion 302 to which the power supply voltage VSS is applied, a photoelectric conversion element 304, and an amplifier circuit 305. The connection portion 301 is electrically connected to the first wiring 111. The connection portion 302 is electrically connected to the second wiring 112.

The photoelectric conversion element 304 is an element for converting received light into electrical signals. Here, the photoelectric conversion element 304 is formed using a photodiode. The amplifier circuit 305 is a circuit for amplifying the output of the photoelectric conversion element 304. In the photodetector of this embodiment, a circuit formed using the photoelectric conversion element 304 and the amplifier circuit 305 corresponds to the integrated circuit 101 in FIG. 1A. In addition, here, the amplifier circuit 305 is formed using a current mirror circuit. The current mirror circuit includes one transistor 307, and a plurality of transistor 308 connected in parallel to each other. In this embodiment, the transistor 307 and the transistors 308 in the amplifier circuit 305 are both n-channel transistors; however, the transistor 307 and the transistors 308 can be both p-channel transistors. The amplification factor of the transistor 307 is adjusted in accordance with the number of the transistors 308. Thus, in order to amplify the output of the photoelectric conversion element 304 100-fold, for example, hundred transistors 308 are connected in parallel with respect to one transistor 307.

When the photoelectric conversion element 304 receives light, the resistance value of the photoelectric conversion element 304 is decreased. When the power supply potential VDD is applied to the first wiring 111 and the power supply potential VSS is applied to the second wiring 112, current corresponding to the resistance value of the photoelectric conversion element 304 flows to the photoelectric conversion element 304. When the current flows to the transistor 307, voltage corresponding to the channel resistance of the transistor 307 is generated in a gate of the transistor 307, and the voltage is applied to each gate of the plurality of transistors 308. When the power supply potential VDD is applied to a drain and the power supply potential VSS is applied to a source, current flows to the plurality of transistors 308, current flowing to the photoelectric conversion element 304 is amplified, and the amplified current is output from the amplifier circuit 305. That is, the value of output current of the amplifier circuit 305 reflects the amount of light received by the photoelectric conversion element 304.

In this embodiment, instead of the amplifier circuit 305, an attenuation circuit which attenuates the output current of the photoelectric conversion element 304 can be provided. The attenuation circuit can be formed using a current mirror circuit. In such a current mirror circuit, the number of the transistors 307 is made larger than the number of the transistors 308. For example, in order to amplify the output of the photoelectric conversion element 304 hundredth, one transistor 308 is provided with respect to hundred transistors 307 connected in parallel.

Next, the layout of the photodetector of this embodiment is described with reference to FIG. 10. FIG. 10 illustrates a semiconductor film and first to third conductive films included in the photodetector. In addition, in this embodiment, the first wiring 111 and the second wiring 112 in Embodiment 4 are used for the photodetector.

In FIG. 10, the amplifier circuit 305 is formed in a region indicated by a chain double-dashed line. In the amplifier circuit 305, a semiconductor film 340 used for the transistor 307 and the transistors 308 is provided. In this embodiment, a source region, a drain region, and a channel region of each of the transistor 307 and the plurality of transistors 308 are formed using one semiconductor film 340. Over the semiconductor film 340, one conductive film 351 which is the first conductive film is formed with an insulating film interposed therebetween. The conductive film 351 is used for gate wirings of the transistor 307 and the transistors 308.

Second conductive films are formed over the conductive film 351 with an insulating film interposed therebetween. Here, as the second conductive films, one conductive film 361, one conductive film 362, one conductive film 363, and one conductive film 364 are formed. The conductive film 361 is used for a drain wiring of the transistor 307. The conductive film 362 is used for a source wiring of each of the transistor 307 and the transistor 308. The conductive film 363 is used for a drain electrode of the transistor 307. With the conductive film 363, a gate electrode of the transistor 307 is electrically connected to the drain electrode thereof. The conductive film 364 is used for an electrode for electrically connecting the photoelectric conversion element 304 and the amplifier circuit 305 to each other. In addition, the conductive film 364 is electrically connected to the conductive film 351. Thus, the gate electrode of the transistor 307 and a gate electrode of the transistor 308 are electrically connected to the photoelectric conversion element 304.

A photoelectric conversion layer 370 is formed over the second conductive film 364. The photoelectric conversion layer 370 is used for the photoelectric conversion element 304 (the photodiode). The photoelectric conversion layer 370 is formed in contact with the conductive film 364.

Figure 12:
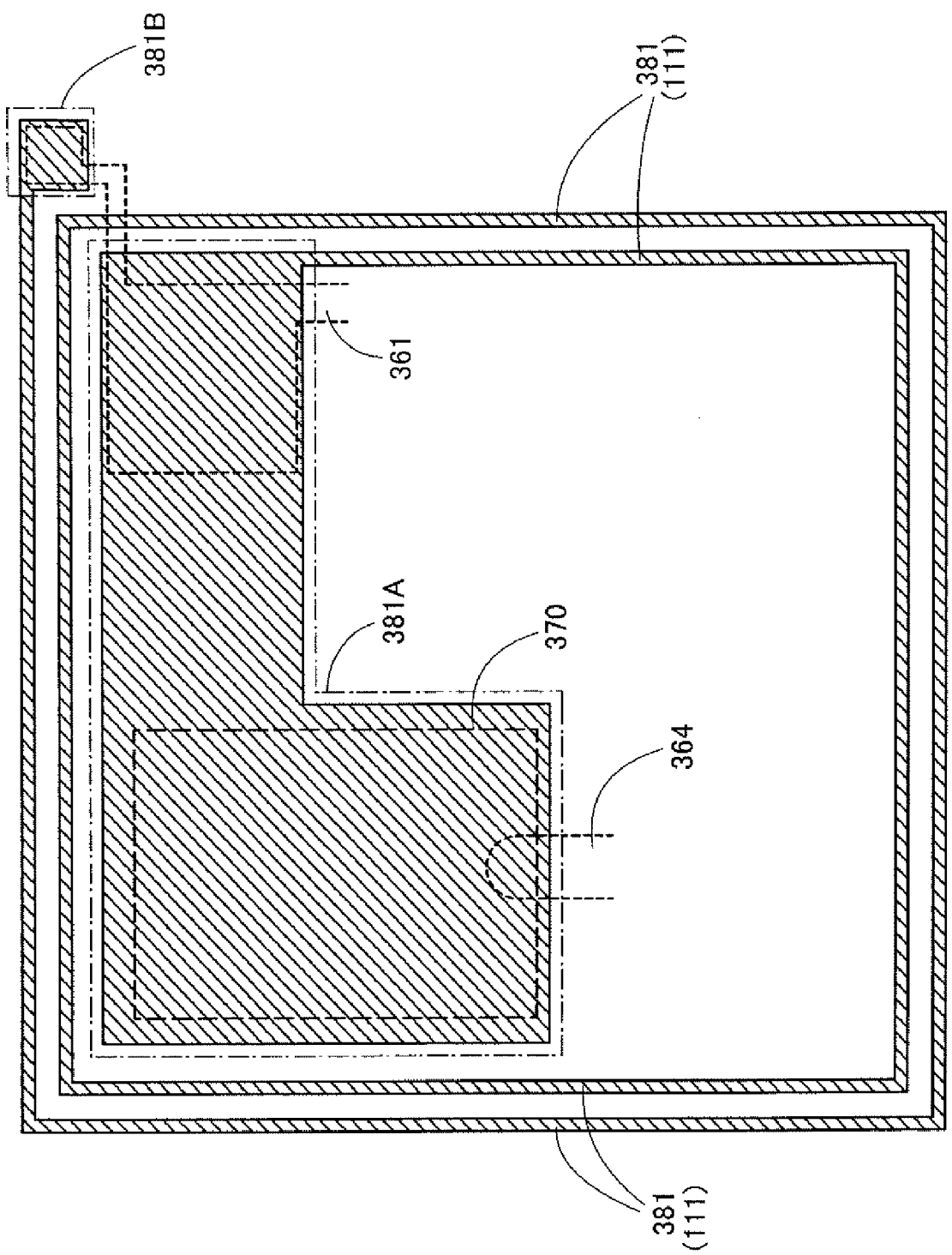
FIG. 12 is a plan view of a conductive film used for a first wiring of the photodetector in FIG. 9.
Figure 13:
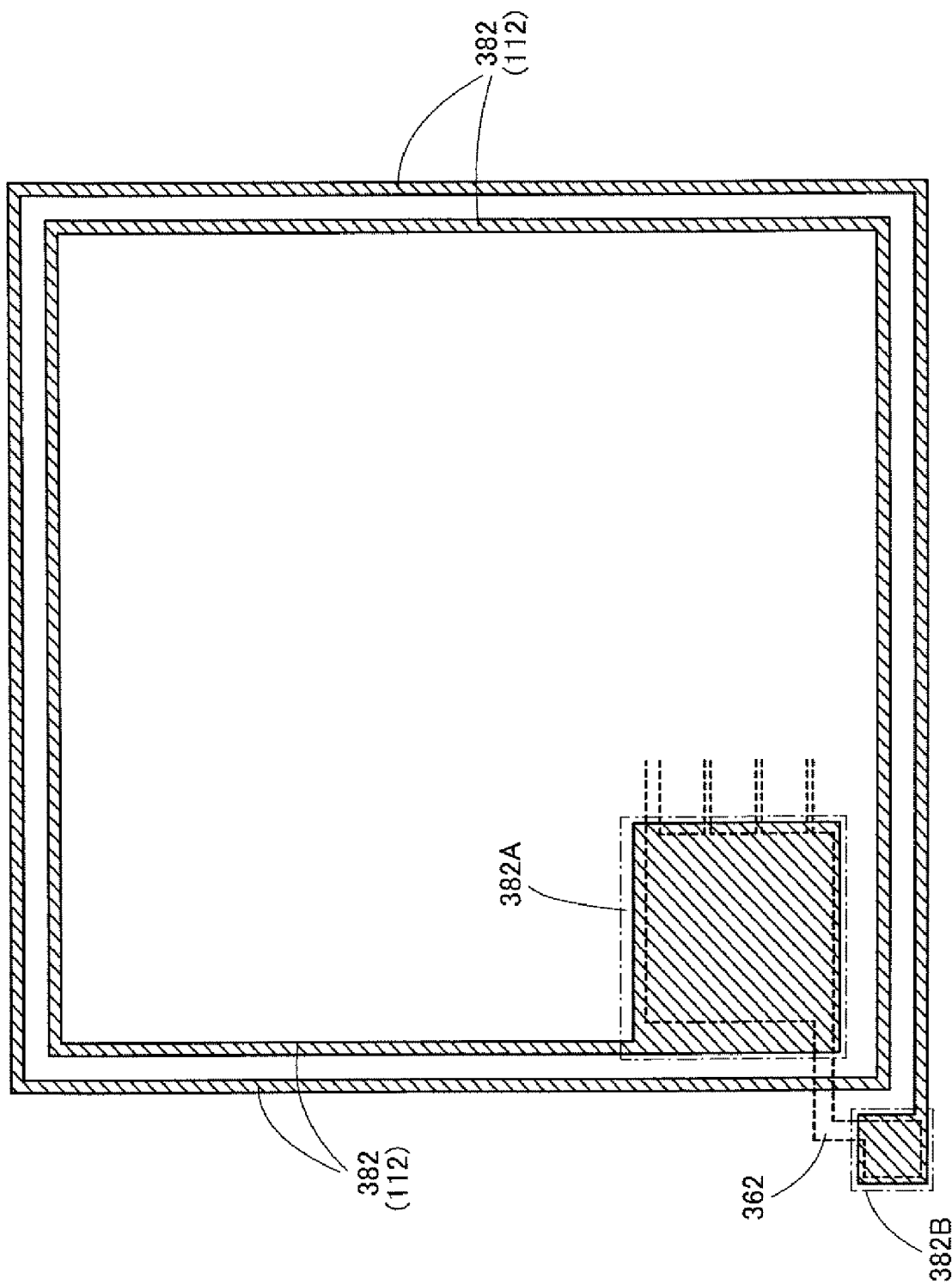
FIG. 13 is a plan view of a conductive film used for a second wiring of the photodetector in FIG. 9.

An insulating film which covers the second conductive films 361 to 364 and the photoelectric conversion layer 370 is formed. Over the insulating film, a conductive film 381 and a conductive film 382 are formed as third conductive films. FIG. 12 is a plan view of the conductive film 381. FIG. 13 is a plan view of the conductive film 382. A portion of the conductive film 381, which surrounds the integrated circuit, is used for the first wiring 111 to which the power supply potential VDD is applied. A portion of the conductive film 382, which surrounds the integrated circuit, is used for the second wiring 112 to which the power supply potential VSS is applied.

In addition, one end portion 381A of the conductive film 381 (a portion surrounded by a chain line in FIG. 12) is electrically connected to the photoelectric conversion layer 370 through a plurality of openings formed in the insulating film. In the end portion 381A, a region overlapping with the conductive film 361 is used for the connection portion 301 for connection to the VDD terminal 102. Further, the end portion 381A also serves as a light-shielding film which shields the photoelectric conversion element 304 from light. That is, with the end portion 381A, light which enters above the photoelectric conversion layer 370 can be blocked. Furthermore, the other end portion 381B of the conductive film 381 (a portion surrounded by a chain line in FIG. 12) is electrically connected to an end portion 361A of the second conductive film 361 through the plurality of openings formed in the insulating film.

In addition, one end portion 382A of the conductive film 382 (a portion surrounded by a chain line in FIG. 13) is used for the connection portion 302 for connection to the VSS terminal 103 to which a power source is connected. The other end portion 382B (a portion surrounded by a chain line in FIG. 13) is electrically connected to an end portion 362A of the second conductive film 362 through the plurality of openings formed in the insulating film.

The photodetector further includes a fourth conductive film. As illustrated in FIG. 11, the fourth conductive film is used for the VDD terminal 102 and the VSS terminal 103. In this embodiment, the VDD terminal 102 and the VSS terminal 103 are formed using conductive films of a four-layer structure; the VDD terminal 102 is electrically connected to the end portion 381A of the conductive film 381; and the VSS terminal 103 is electrically connected to the end portion 382A of the conductive film 382.

With such a structure, the power supply voltage VDD applied to the VDD terminal 102 is applied to a cathode of the photoelectric conversion element 304 and a drain wiring of the transistor 308 in the amplifier circuit 305 through the conductive film 381 (the first wiring 111). In addition, the power supply voltage VSS applied to the VSS terminal 103 is applied to the source wiring of each of the transistor 307 and the transistors 308 in the amplifier circuit 305 through the conductive film 382 (the second wiring 112).

Note that FIG. 11 is not a cross-sectional view taken along a particular section line in the plan view of FIG. 10 but a cross-sectional view for illustrating the layered structure of films used for the photodetector and electrical connections for connection to conductive films formed in different layers. In FIG. 11, in a cross-sectional view taken along line a-b, the cross-sectional structures of both the end portions 382A and 382B of the conductive film 382, the first wiring 111, and the second wiring 112 are mainly illustrated. In a cross-sectional view taken along line b-c, the transistor 308 is illustrated as a cross section of the amplifier circuit 305. In a cross-sectional view taken along line c-d, the cross-sectional structures of the photoelectric conversion element 304, both the end portions 381A and 381B of the conductive film 381, the first wiring 111, and the second wiring 112 are mainly illustrated.

In this embodiment, a glass substrate 310 is used as a substrate over which the integrated circuit is formed. When light 303 transmitted through the glass substrate 310 enters the photoelectric conversion element 304, optical signals are converted into electric signals in the photoelectric conversion element 304. The electric signals are amplified in the amplifier circuit 305 and the amplified signals are output from the VDD terminal 102 and the VSS terminal 103. In this embodiment, a coloring layer for selectively transmitting light in a particular wavelength range (a color filter layer) can be formed on a side of the glass substrate 310, where the light 303 enters. For the coloring layer, a resin in which a pigment is dispersed or the like can be used, for example.

Next, a method for manufacturing the photodetector and the cross-sectional structure of the photodetector are described. First, the transistors 307 and 308 included in the amplifier circuit 305 are formed over the glass substrate 310.

A method for forming the transistors 307 and 308 is described with reference to cross-sectional views in FIGS. 14A to 14D and FIGS. 15A to 15D.

The glass substrate 310 is prepared. A non-alkali glass substrate is preferably used as the glass substrate 310. As a non-alkali glass substrate, for example, an aluminosilicate glass substrate, an aluminoborosilicate glass substrate, a barium borosilicate glass substrate, or the like can be used. Instead of the glass substrate 310, a quartz substrate can be used.

Figure 14A:
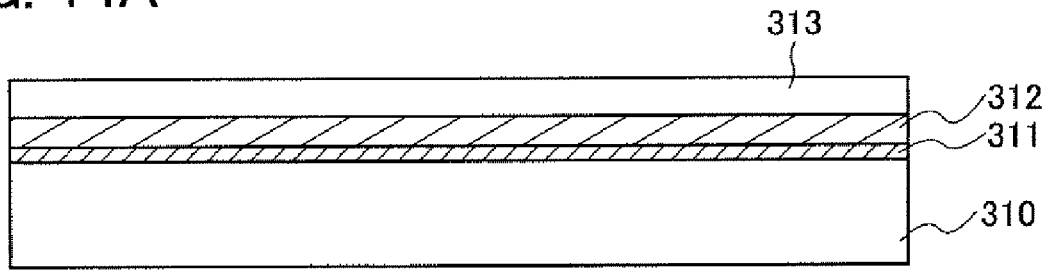
FIGS. 14A to 14D are cross-sectional views illustrating an example of a method for manufacturing a transistor included in the photodetector in FIG. 9.
Figure 14B:
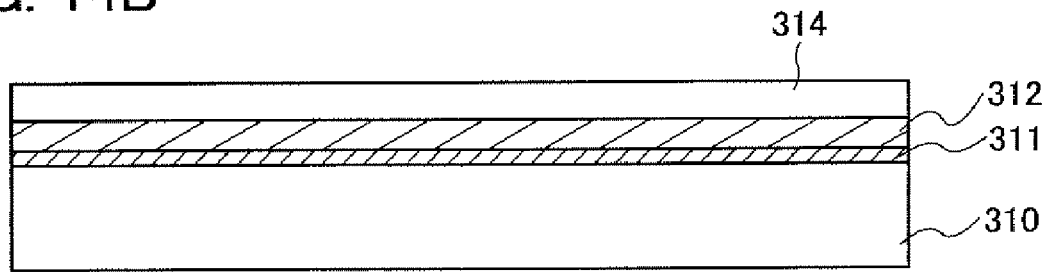

Next, a base insulating film for the semiconductor film 340, which has a thickness greater than or equal to 50 nm and less than or equal to 300 nm, and a semiconductor film which has a thickness greater than or equal to 20 nm and less than or equal to 100 nm and is used for the semiconductor film 340 are formed over the glass substrate 310. Here, as illustrated in FIG. 14A, a two-layer insulating film of a silicon nitride oxide film 311 and a silicon oxynitride film 312 is formed as the base insulating film, and an amorphous silicon film 313 is formed as the semiconductor film.

The base insulating film is provided so as to prevent an alkali metal (typically Na) or an alkaline earth metal contained in the glass substrate from diffusing and adversely affecting electric characteristics of a semiconductor element such as a transistor. The base insulating film may have either a single-layer structure or a layered structure; however, the base insulating film preferably includes at least one barrier film for preventing diffusion of an alkali metal and an alkaline earth metal. In this embodiment, the silicon nitride oxide film 311 is provided as a barrier film. As the barrier film, a nitride oxide film such as a silicon nitride oxide film, or a nitride film such as a silicon nitride film or an aluminum nitride film is preferably used. In order to decrease the interface state density between the semiconductor film 340 and the base insulating film which are used for the transistors 307 and 308, the silicon oxynitride film 312 is formed.

In this embodiment, the 140-nm-thick silicon nitride oxide film 311, the 100-nm-thick silicon oxynitride film 312, and the 50-nm-thick amorphous silicon film 313 are successively formed using one PECVD apparatus. The source gas of the silicon nitride oxide film 311 is $SiH_4$, $N_2O$, $NH_3$, and $H_2$. The source gas of the silicon oxynitride film 312 is $SiH_4$ and $N_2O$. The source gas of the amorphous silicon film 313 is $SiH_4$ and $H_2$. By changing the source gases, the three films can be successively formed in one chamber.

In this embodiment, the amorphous silicon film 313 is crystallized so that a crystalline silicon film 314 is formed (see FIG. 14B), and the semiconductor film 340 is formed using the crystalline silicon film 314. As a method for crystallizing the semiconductor film, a solid phase epitaxy method using a lamp annealing apparatus or a furnace, a method for crystallizing and melting the semiconductor film by laser light irradiation, or the like can be used. Here, the amorphous silicon film 313 is subjected to solid phase epitaxy to be crystallized. In addition, in order to perform the solid phase epitaxy at a heating temperature lower than or equal to 600° C. for a short time, a metal element is introduced into the amorphous silicon film 313. A method for crystallizing the amorphous silicon film 313 is specifically described below.

First, a surface of the amorphous silicon film 313 is cleaned with ozone water so that an ultrathin (several-nanometer-thick) oxide film is formed. Thus, the wettability of the surface of the amorphous silicon film 313 is improved. Subsequently, the surface of the amorphous silicon film 313 is coated with a nickel acetate solution containing 10 ppm by weight of nickel by a spinner.

Next, the amorphous silicon film 313 is heated in a furnace so that the crystalline silicon film 314 is formed. For example, in order to crystallize the amorphous silicon film 313, the amorphous silicon film 313 is heated at 500° C. for 1 hour, for example, and then, is heated at 550° C. for 4 hours. With the catalytic action of nickel, the crystalline silicon film 314 can be formed at low temperature for a short time. Further, with the catalytic action of nickel, the crystalline silicon film 314 having few dangling bonds at crystal grain boundaries can be formed. As a metal element which promotes the crystallization of silicon, Fe, Co, Ru, Rh, Pd, Os, Ir, Pt, or the like can be used instead of Ni.

As a method for introducing such a metal element into the amorphous silicon film 313, a method by which a film containing a metal element as its main component is formed on the surface of the amorphous silicon film 313, a method by which a metal element is added to the amorphous silicon film 313 by plasma doping, or the like can be used instead of the method by which the amorphous silicon film 313 is coated with a solution of such a metal element.

Next, in order to reduce the crystal defects in the crystalline silicon film 314 and to improve the degree of crystallization, the crystalline silicon film 314 is irradiated with laser light. A laser beam having a wavelength less than or equal to 400 nm is preferably used for the laser light. As such laser light, for example, XeCl excimer laser light (XeCl: a wavelength of 308 nm), the second harmonic or the third harmonic of a YAG laser, or the like can be used. Before the laser light irradiation, an oxide film formed on a surface of the crystalline silicon film 314 is preferably removed using dilute hydrofluoric acid or the like.

In this embodiment, treatment for gettering of nickel, which is introduced for the crystallization, from the crystalline silicon film 314 is performed for the following reason. Nickel is useful for the crystallization of the amorphous silicon film 313; however, if nickel is included in the crystalline silicon film 314 at high concentration, nickel might be a factor of making the electric characteristics of the transistors 307 and 308 worse, for example, the leakage current of the transistors 307 and 308 is increased. An example of the gettering treatment is described below.

First, the surface of the crystalline silicon film 314 is cleaned with ozone water for about 120 seconds so that an oxide film having a thickness approximately greater than or equal to 1 nm and less than or equal to 10 nm is formed on the surface of the crystalline silicon film 314. Instead of the surface treatment with ozone water, UV light irradiation may be performed. Next, an amorphous silicon film containing Ar is formed to a thickness approximately greater than or equal to 10 nm and less than or equal to 400 nm on the surface of the crystalline silicon film 314 with the oxide film interposed therebetween. The concentration of Ar in the amorphous silicon film is preferably higher than or equal to $1 \times 10^{18}$ atoms/$cm^3$ and lower than or equal to $1 \times 10^{22}$ atoms/$cm^3$. In addition, instead of Ar, another element of Group 18 may be added to the amorphous silicon film.

An element of Group 18 is added to the amorphous silicon film in order to form a gettering site in the amorphous silicon film by generating distortion in the amorphous silicon film. There are two factors which cause the distortion by the addition of the element of Group 18. One is the formation of dangling bonds in crystals by the addition of the element of Group 18. The other is the addition of the element of Group 18 between crystal lattices.

For example, in order to form the amorphous silicon film containing Ar (hereinafter referred to as the Ar:a-Si film) by PECVD, $SiH_4$, $H_2$, and Ar are used as a source gas. The flow ratio of $SiH_4$ to Ar ($SiH_4$/Ar) is preferably greater than or equal to 1/999 and less than or equal to 1/9. Further, process temperature is preferably higher than or equal to 300° C. and lower than or equal to 500° C. RF power density for exciting the source gas is preferably higher than or equal to 0.0017 W/cm$^2$ and lower than or equal to 0.48 W/cm$^2$. Process pressure is preferably higher than or equal to 1.333 Pa and lower than or equal to 66.65 Pa.

For example, in the case of forming the Ar:a-Si film by sputtering, single crystal silicon is used for a target and Ar is used for a sputtering gas. By performing grow discharge of the Ar gas and sputtering of the single crystal silicon target with Ar ions, the amorphous silicon film containing Ar can be formed. The concentration of Ar in the amorphous silicon film can be controlled in accordance with power, pressure, temperature, or the like for the grow discharge. Process pressure is preferably higher than or equal to 0.1 Pa and lower than or equal to 5 Pa. As the pressure is decreased, the concentration of Ar in the amorphous silicon film can be made higher. Thus, the pressure is preferably lower than or equal to 1.5 Pa. It is not necessary to heat the glass substrate 310 in the process particularly, and process temperature is preferably lower than or equal to 300° C.

After the Ar:a-Si film is formed, heat treatment at 650° C. for 3 minutes is performed in the furnace for gettering. With this heat treatment, Ni contained in the crystalline silicon film 314 is separated out to the Ar:a-Si film and is captured. Accordingly, the concentration of Ni in the crystalline silicon film 314 can be lowered. After the heat treatment is completed, the Ar:a-Si film is removed by etching. In this etching, the oxide film serves as an etching stopper. After the Ar:a-Si film is removed, the oxide film formed on the surface of the crystalline silicon film is removed using dilute hydrofluoric acid or the like. Thus, the crystalline silicon film 314 in which the concentration of Ni is reduced is formed.

Figure 14C:
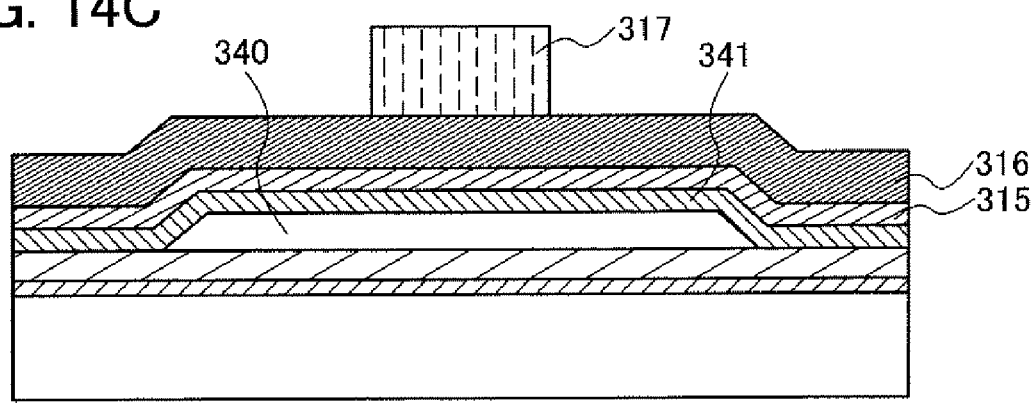

Subsequently, a resist mask is formed over the crystalline silicon film 314, and the crystalline silicon film 314 is etched using the resist mask so that the semiconductor film 340 is formed, as illustrated in FIG. 14C. In this embodiment, as illustrated in FIG. 10, one semiconductor film 340 is formed corresponding to the transistor 307 and the plurality of transistors 308. By forming the plurality of transistors by using one semiconductor film 340, connections between source regions and connections between drain region are facilitated. In the semiconductor film 340, a plurality of openings for dividing channel formation regions of the transistors 307 and 308 are formed. Note that in the cross-sectional views in FIGS. 14C and 14D and FIGS. 15A to 15C, the semiconductor film 340 is provided for each transistor, which is illustrated in order to facilitate understanding of the structure of each transistor. The same can be said for the cross-sectional view in FIG. 11.

Here, before the crystalline silicon film 314 is etched, an element which serves as an acceptor is added to the crystalline silicon film 314 so that the threshold voltage of the transistors 307 and 308 is controlled. For example, boron is used as an element which serves as an acceptor and is preferably contained in the crystalline silicon film 314 at a concentration higher than or equal to $1 \times 10^{16}$ atoms/cm$^3$ and lower than or equal to $5 \times 10^{17}$ atoms/cm$^3$.

Note that in this embodiment, the semiconductor film 340 is formed using silicon; however, the semiconductor film 340 can be formed using another element of Group 14, such as germanium, silicon germanium, or silicon carbide. Alternatively, a compound semiconductor such as GaAs, InP, SiC, ZnSe, GaN, or SiGe, or an oxide semiconductor such as zinc oxide or tin oxide can be used.

Next, as illustrated in FIG. 14C, a gate insulating film and a conductive film used for the conductive film 351 are formed over the semiconductor film 340. Here, as the gate insulating film, a 30-nm-thick silicon oxynitride film 341 is formed. The silicon oxynitride film 341 is formed using $SiH_4$ and $N_2O$ as a source gas by PECVD. In addition, as the conductive film, a conductive film having a two-layer structure of a 30-nm-thick tantalum nitride film 315 and a 170-nm-thick tungsten film 316 is formed. The tantalum nitride film 315 and the tungsten film 316 are formed by sputtering. Instead of the stacked film of the tantalum nitride film 315 and the tungsten film 316, for example, a stacked film of a tungsten nitride film and a tungsten film or a stacked film of a molybdenum nitride film and a molybdenum film can be formed. In this embodiment, since a source region, a drain region, and a low concentration impurity region are formed in the semiconductor film 340 in a self-aligned manner by using the conductive film 351, the upper-layer conductive film is made smaller than the lower-layer conductive film when viewed from above. Therefore, the etching selectivity of the lower-layer conductive film with respect to the upper-layer conductive film is preferably higher. In this respect, the stacked layer of the tantalum nitride film 315 and the tungsten film 316 is preferable.

Figure 14D:
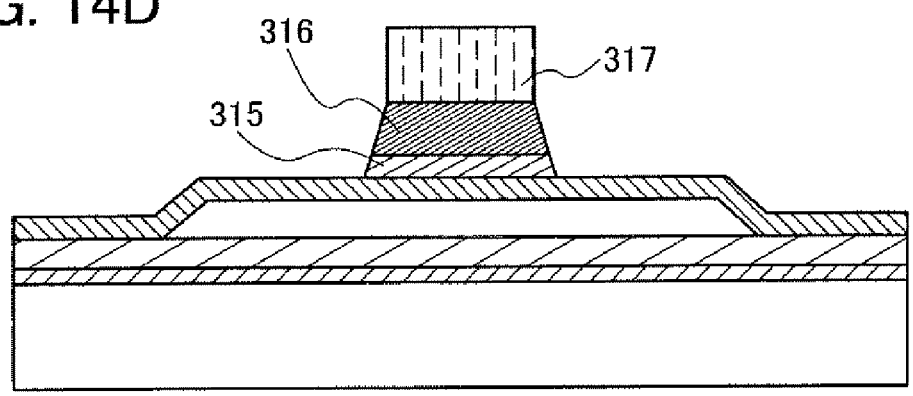

Next, a resist mask 317 is formed over the tungsten film 316. Etching is performed twice using the resist mask 317. First, as illustrated in FIG. 14D, the tantalum nitride film 315 and the tungsten film 316 are etched using the resist mask 317. With this first etching, cross sections of the stacked film of the tantalum nitride film 315 and the tungsten film 316 are tapered. For example, this etching can be performed using a mixture gas of $CF_4$, $Cl_2$, and $O_2$ as an etching gas by an inductively coupled plasma (ICP) etching apparatus.

Figure 15A:
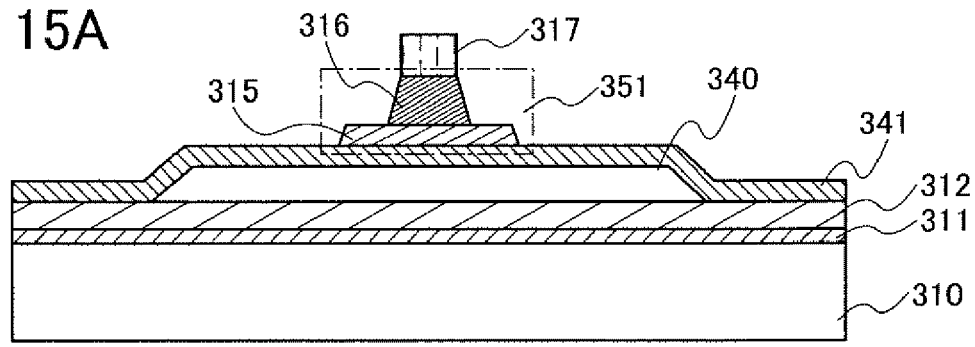
FIGS. 15A to 15D are cross-sectional views illustrating the method for manufacturing a transistor after the step in FIG. 14D.
Figure 15B:
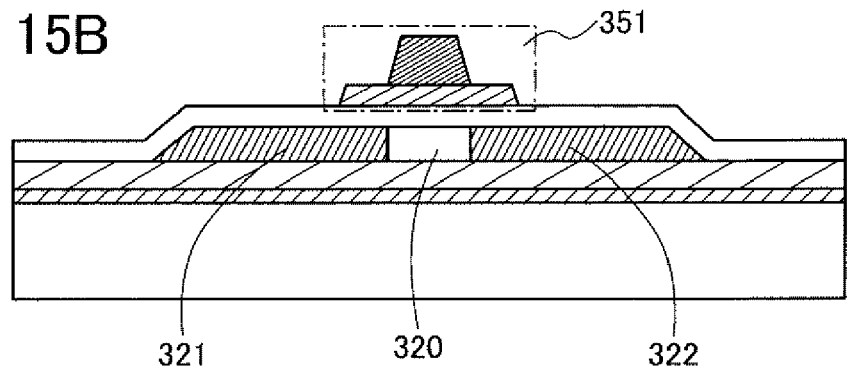

Further, as illustrated in FIG. 15A, the upper-layer tungsten film 316 is selectively etched using the resist mask 317. This etching is anisotropic etching and can be performed using a mixture gas of $Cl_2$, $SF_6$ and $O_2$ as an etching gas by an ICP etching apparatus. With this etching, the conductive film 351 is formed. In the conductive film 351, end portions of the tungsten film 316 are on a top surface of the tantalum nitride film 315, and the tungsten film 316 is smaller than the tantalum nitride film 315 when viewed from above.

After the resist mask 317 is removed, a donor element is added to the semiconductor film 340 so that an n-type source region, an n-type drain region, and a low concentration impurity region are formed. Here, phosphorus is added as the donor element. First, in order to form the low concentration impurity region, phosphorus is added under conditions of a low dosage and high accelerating voltage. $PH_3$ can be used as a source gas of phosphorus. Under these conditions, phosphorus is added to the semiconductor film 340 through a portion of the conductive film 351, where only the tantalum nitride film 315 is formed, so that a low concentration impurity region 321 and a low concentration impurity region 322 are formed. Further, a channel formation region 320 is also formed in a self-aligned manner corresponding to a portion where the tantalum nitride film 315 and the tungsten film 316 are stacked.

Figure 15C:
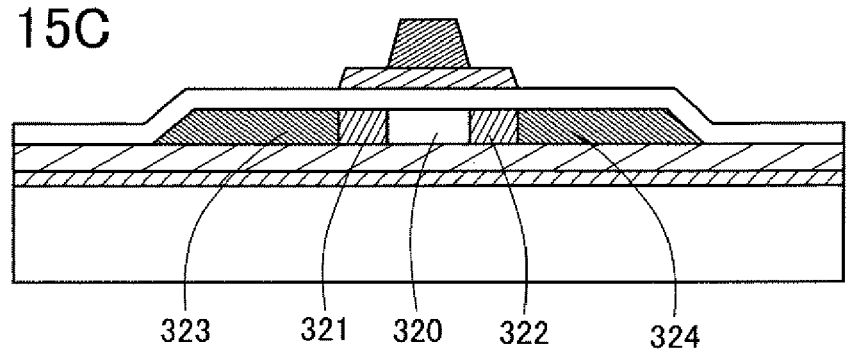
Figure 15D:
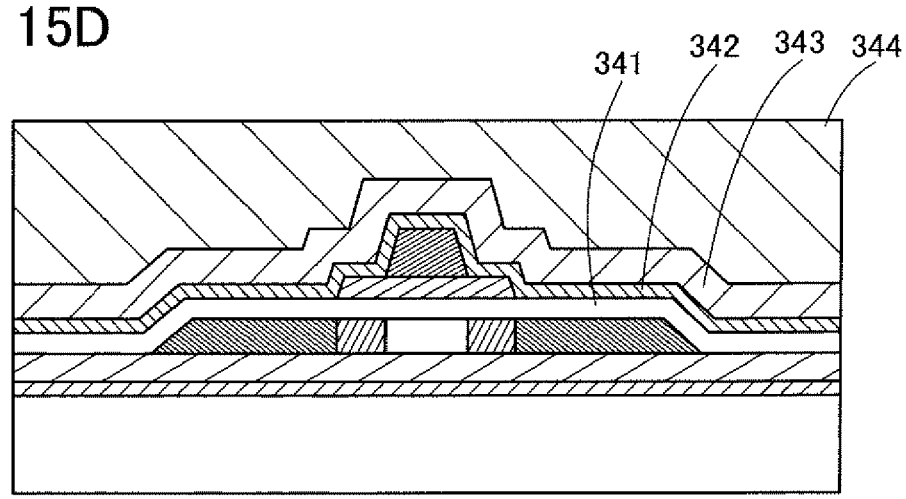

Next, in order to form the source region and the drain region, phosphorus is added under conditions of a high dosage and low accelerating voltage. Under these conditions, the entire conductive film 351 serves as a mask, and a source region 323 and a drain region 324 are formed in the semiconductor film 340 in a self-aligned manner, as illustrated in FIG. 15C.

Next, a first interlayer insulating film is formed over the glass substrate 310 so as to cover the conductive film 351. In this embodiment, the first interlayer insulating film has a three-layer structure. A first layer is a 30-nm-thick silicon oxynitride film 342. A second layer is a 165-nm-thick silicon nitride oxide film 343. A third layer is a 600-nm-thick silicon oxynitride film 344. These films 342 to 344 are formed using a PECVD apparatus. First, the silicon oxynitride film 342 is formed using $SiH_4$ and $N_2O$ as a source gas. Then, heat treatment is performed so that phosphorus added to the semiconductor film 340 is activated.

After the heat treatment for activation is completed, the silicon nitride oxide film 343 and the silicon oxynitride film 344 are formed using a PECVD apparatus. $SiH_4$, $N_2O$, $NH_3$, and $H_2$ are used as a source gas of the silicon nitride oxide film 343 so that the concentration of hydrogen in the silicon nitride oxide film 343 is high. $SiH_4$ and $N_2O$ are used as a source gas of the silicon oxynitride film 344. After the silicon oxynitride film 344 is formed, heat treatment is performed so that hydrogen contained in the silicon nitride oxide film 343 is dispersed, whereby dangling bonds in the semiconductor film 340 are terminated with hydrogen. This heat treatment can be performed at a temperature higher than or equal to 300° C. and lower than or equal to 500° C.

The subsequent steps are described with reference to cross-sectional views in FIGS. 16A to 16C, FIGS. 17A and 17B, FIGS. 18A and 18B, and FIG. 19. Methods for illustration in FIGS. 16A to 16C FIGS. 17A and 17B, FIGS. 18A and 18B, and FIG. 19 are similar to that of FIG. 11.

The stacked film formed using the silicon oxynitride film 341, the silicon oxynitride film 342, the silicon nitride oxide film 343, and the silicon oxynitride film 344 is etched using a resist mask so that openings which serve as contact holes are formed. The openings are formed in a connection portion between the conductive film 361 and the drain region 324 of the semiconductor film 340, a connection portion between the conductive film 362 and the source region 323 of the semiconductor film 340, a connection portion between the conductive film 363 and the conductive film 351, and a connection portion between the conductive film 364 and the conductive film 351.

Next, a conductive film used for the conductive films 361 to 364 is formed over the silicon oxynitride film 344. Here, a 400-nm-thick titanium film is formed by sputtering. A resist mask is formed over the titanium film and is used for etching of the titanium film so that the conductive films 361 to 364 are formed (see FIG. 11 and FIG. 16A). As illustrated in FIG. 11, the conductive film 381 and the conductive film 382 are formed adjacent to each other so as to surround the integrated circuit. Thus, resistance can be added between the VDD terminal 102 to which the power supply potential VDD is applied, and the photoelectric conversion element 304 and the amplifier circuit 305, and between the VDD terminal 103 to which the power supply potential VSS is applied and the amplifier circuit 305.

Note that the second conductive films 361 to 364 and the third conductive films 381 and 382 are each preferably formed using a film of titanium, a titanium alloy, a titanium compound, molybdenum, a molybdenum alloy, or a molybdenum compound. The film formed using such a conductive material has advantages that heat resistance is high, electrolytic corrosion due to contact with a silicon film does not easily occur, and migration does not easily occur.

Next, as illustrated in FIG. 16A, the photoelectric conversion layer 370 used for the photoelectric conversion element 304 is formed over the silicon oxynitride film 344. Here, since the photoelectric conversion element 304 is formed using a photodiode having pin junction, the photoelectric conversion layer 370 is formed using a three-layer stacked film of a semiconductor film which has p-type conductivity (hereinafter referred to as a p-type semiconductor film), a semiconductor film which has i-type (intrinsic) conductivity (hereinafter referred to as an i-type semiconductor film), and a semiconductor film which has n-type conductivity (hereinafter referred to as an n-type semiconductor film). Here, an amorphous silicon film is formed for the photoelectric conversion layer 370 by using a PECVD apparatus. Note that each of the semiconductor films used for the photoelectric conversion layer 370 may be either a microcrystalline silicon film or a single crystalline silicon film.

First, over the silicon oxynitride film 344, a 60-nm-thick p-type amorphous silicon film 371, a 400-nm-thick i-type amorphous silicon film 372, and an 80-nm-thick n-type amorphous silicon film 373 are successively formed using a PECVD apparatus so as to cover the conductive films 361 to 364. By adding boron by using $SiH_4$, $H_2$, and $B_2H_6$ as a source gas of the p-type amorphous silicon film 371, p-type conductivity is imparted to the amorphous silicon film 371. Without purposely adding an impurity element which serves as a donor or an acceptor and by using $SiH_4$ and $H_2$ as a source gas of the i-type amorphous silicon film 372, i-type conductivity is imparted to the amorphous silicon film 372. By adding phosphorus by using $SiH_4$, $H_2$, and $PH_3$ as a source gas of the n-type amorphous silicon film 373, n-type conductivity is imparted to the amorphous silicon film 373. Subsequently, the stacked film formed using the amorphous silicon films 371 to 373 is etched using a resist mask so that the photoelectric conversion layer 370 is formed (see FIG. 11 and FIG. 16A).

Note that a plurality of integrated circuits (specifically, the circuits illustrated in the circuit diagram in FIG. 9) are simultaneously formed over one glass substrate 310. After these integrated circuits are completed, the glass substrate 310 is cut in accordance with the size of the photodetector so that the integrated circuits are divided into separate integrated circuits. Here, in order to appropriately protect side surfaces of the integrated circuit divided, the silicon oxynitride film 344 formed around the integrated circuit (in portions indicated by dotted lines 346) is removed, as illustrated in FIG. 16B. This step can be performed by etching.

Next, an interlayer insulating film is formed so as to cover the silicon nitride oxide film 343, the silicon oxynitride film 344, the conductive films 361 to 364, and the photoelectric conversion layer 370. Here, as illustrated in FIG. 16C, a two-layer insulating film formed using a 100-nm-thick silicon nitride oxide film 375 and an 800-nm-thick silicon oxide film 376 is formed.

The silicon nitride oxide film 375 is formed using a PECVD apparatus by using $SiH_4$, $N_2O$, $NH_3$, and $H_2$ as a source gas. The silicon nitride oxide film 354 serves as a passivation film. Instead of the silicon nitride oxide film 354, a silicon nitride film may be formed. The silicon nitride film can be formed using a PECVD apparatus by using $SiH_4$, $NH_3$, and $H_2$ as a source gas. Further, the silicon oxide film 376 is formed using a PECVD apparatus by using $O_2$ and tetraethoxysilane (abbr.: TEOS and chemical formula: $Si(OC_2H_5)_4$) as a source gas. Instead of the silicon oxide film 376, a silicon oxynitride film may be formed using a PECVD apparatus.

Next, the stacked film formed using the silicon nitride oxide film 375 and the silicon oxide film 376 is etched using a resist mask so that openings which serve as contact holes are formed. The openings are formed in a connection portion between the end portion 361A of the conductive film 361 and the end portion 381B of the conductive film 381, a connection portion between the photoelectric conversion layer 370 (the n-type amorphous silicon film 373) and the end portion 381A of the conductive film 381, and a connection portion between the end portion 362A of the conductive film 362 and the end portion 382B of the conductive film 382.

Next, a conductive film used for the conductive films 381 and 382 is formed over the silicon oxide film 376. Here, a 200-nm-thick titanium film is formed by sputtering. A resist mask is formed over the titanium film and is used for etching of the titanium film so that the conductive films 381 and 382 are formed (see FIG. 11 and FIG. 17A). Through the steps, the integrated circuits are completed.

Next, as illustrated in FIG. 17B, except for the silicon nitride oxide film 311, the other insulating films 312, 341, 342, 343, 375, and 376 are removed from the peripheral portions of the integrated circuit (portions indicated by dotted lines 377). This step can be performed by etching. The insulating films are removed from the peripheral portions of the integrated circuit in this manner in order to appropriately protect the side surfaces of the integrated circuit divided, in a manner similar to the case of removing the silicon oxynitride film 344 in the step of FIG. 16B.

Next, as illustrated in FIG. 18A, a 100-nm-thick silicon nitride oxide film 384 is formed. The silicon nitride oxide film 384 is formed using a PECVD apparatus by using $SiH_4$, $N_2O$, $NH_3$, and $H_2$ as a source gas. The silicon nitride oxide film 384 serves as a passivation film. A portion where the third conductive films 381 and 382, and all the insulating films (311, 341, 342, 343 and the portions indicated by the dotted lines 377) are exposed is covered with the silicon nitride oxide film 384. Therefore, in the integrated circuit, the glass substrate 310 side is protected with the silicon nitride oxide film 311 which serves as the barrier film, and the side where the VDD terminal 102 and the VSS terminal 103 are formed is protected with the silicon nitride oxide film 384. With such a structure, the integrated circuit can be prevented from invasion of moisture or an impurity such as an organic substance.

Next, as illustrated in FIG. 18B, a sealing film 385 is formed. With the sealing film 385, the top surface and the side surfaces of the integrated circuit are sealed together with the first wiring 111 and the second wiring 112. The thickness of the sealing film 385 is preferably greater than or equal to 1 μm, and is approximately 1 to 30 μm. Since the sealing film is formed thick in this manner, the sealing film 385 is preferably formed using a resin film. Here, by forming a photosensitive epoxy-phenol-based resin film by a printing method, the sealing film 385 having openings in connection portions for connection to the VDD terminal 102 and the VSS terminal 103 is formed.

As illustrated in FIG. 18B, since the first wiring 111 (the conductive film 381) and the second wiring 112 (the conductive film 382) are adjacent to each other with the silicon nitride oxide film 384 and the sealing film 385 interposed therebetween, capacitance can be added between the first wiring 111 and the second wiring 112.

Figure 19:
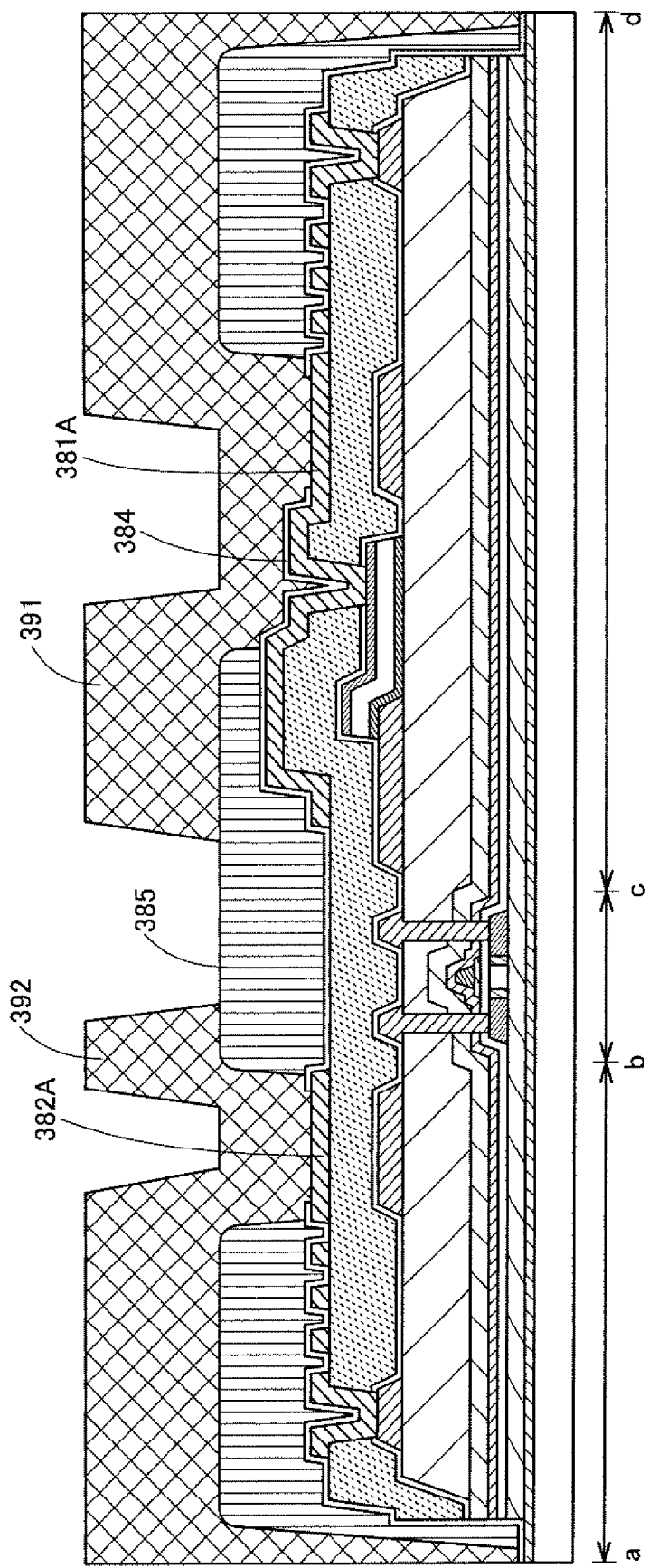
FIG. 19 is a cross-sectional view illustrating the method for manufacturing the photodetector after the step in FIG. 18B.

Next, the silicon nitride oxide film 384 is etched using a resist mask so that a connection portion between the end portion 381A of the conductive film 381 and the VDD terminal 102 and a connection portion between the end portion 382A of the conductive film 382 and the VSS terminal 103 are removed (see FIG. 19).

Next, a conductive film 391 used for the VDD terminal 102 and a conductive film 392 used for the VSS terminal 103 are formed. Here, a printing method such as a screen printing method is used for forming the conductive films 391 and 392. The conductive films 391 and 392 are formed by printing a conductive paste in a predetermined position and baking the paste. In this embodiment, the conductive films 391 and 392 are each formed to a thickness of approximately 15 μm by using a conductive paste containing nickel particles.

A conductive paste refers to a material in which metal particles or metal powder is dispersed into a binder formed using a resin. By solidifying such a conductive paste, a conductive resin film is formed. Thus, since the conductive films 391 and 392 are formed using a conductive resin film, adhesion thereof to a solder is weak. Therefore, in order to improve the adhesion of the VDD terminal 102 and the VSS terminal 103 to a solder, a conductive film having a predetermined shape is formed on each top surface of the conductive films 391 and 392 by sputtering using a metal mask. Here, as illustrated in FIG. 11, a three-layer conductive film is formed over each of the conductive films 391 and 392. Titanium films 393 and 394 each having a thickness of 150 nm are formed as first conductive films; nickel films 395 and 396 each having a thickness of 750 nm are formed as second conductive films; and Au films 397 and 398 each having a thickness of 50 nm are formed as third conductive films. Through the steps, the VDD terminal 102 and the VSS terminal 103 each having a four-layer structure are completed.

Next, the glass substrate 310 is cut into separate photodetectors around the integrated circuit (in the portions indicated by the dotted lines 377). The glass substrate 310 can be cut by dicing, laser cutting, or the like. Before the glass substrate 310 is cut into separate photodetectors, the glass substrate 310 can be made thinner by polishing or grinding a rear surface of the glass substrate 310. This step is preferably performed before the conductive films 393 to 398 are formed by sputtering. By making the glass substrate 310 thinner, wearing out of a cutting tool used for cutting the glass substrate 310 can be reduced. Further, by making the glass substrate 310 thinner, the photodetector can be made thinner. For example, the glass substrate 310 having a thickness of approximately 0.5 mm can be made to have a thickness of approximately 0.25 mm. In the case of making the glass substrate 310 thinner, it is preferable that portions where the glass substrate 310 is exposed (the rear surface and the side surfaces) be covered with a resin film so that the glass substrate 310 is protected.

Figure 20:
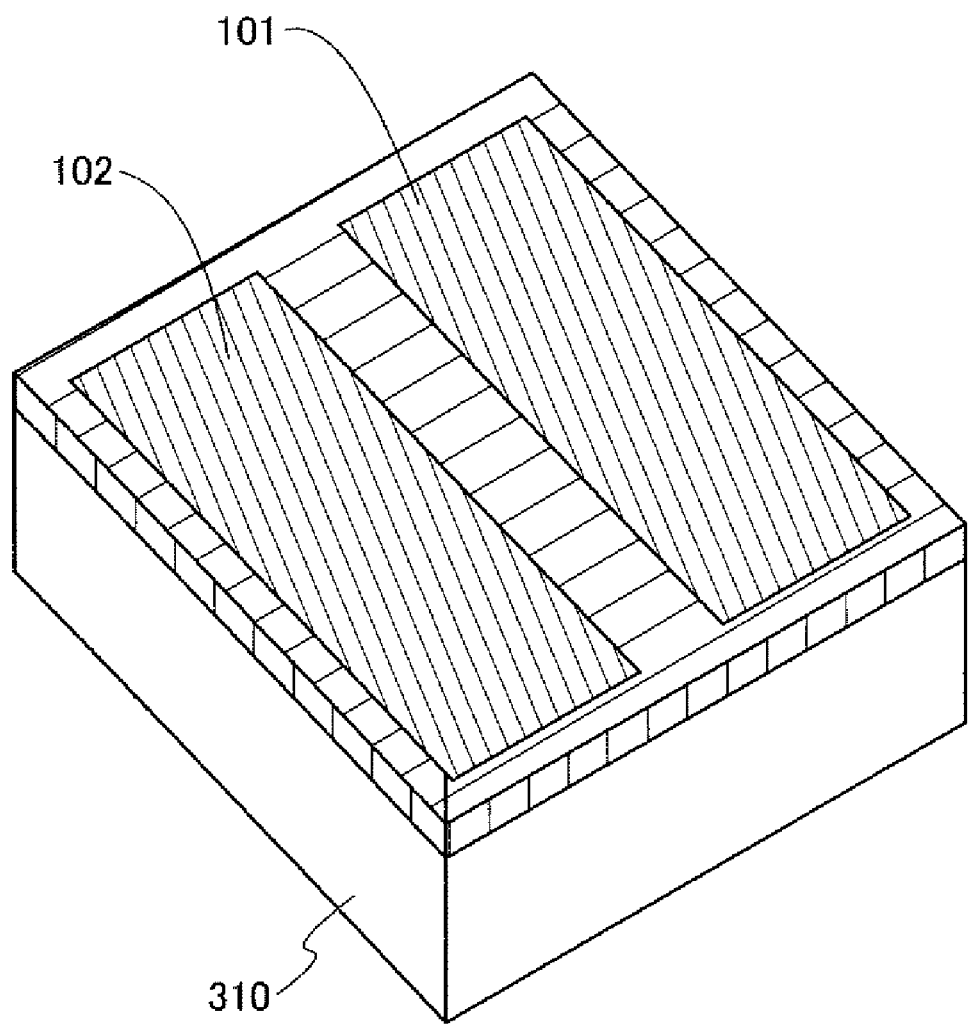
FIG. 20 is an outline view of the photodetector according to an embodiment of the present invention.

FIG. 20 is an outline diagram of the photodetector of this embodiment. As illustrated in FIG. 20, in the photodetector of this embodiment, connection portions for connection to an external circuit are only the VDD terminal 102 and the VSS terminal 103. Thus, in the case where ESD occurs, high voltage is applied from the VDD terminal 102 and the VSS terminal 103 to the integrated circuit. Since the high power supply potential VDD is applied to the drain of each transistor 308 in the amplifier circuit 305 as illustrated in the circuit diagram in FIG. 9, damage due to high voltage is particularly concerned. In this embodiment, the VDD terminal 102 is electrically connected to the amplifier circuit 305 and the photoelectric conversion element 304 through the first wiring 111, and the VSS terminal 103 and the amplifier circuit 305 are electrically connected to each other through the second wiring 112. Therefore, in the case where overvoltage is applied to the VDD terminal 102 and the VSS terminal 103, the energy of the voltage is consumed in added resistance and added capacitance formed by the first wiring 111 and the second wiring 112, so that the probability of damage of the photoelectric conversion element 304 and the amplifier circuit 305 can be reduced.

This embodiment can be combined with any of other embodiments as appropriate. For example, in combination with Embodiment 2, a single semiconductor film or a plurality of semiconductor films which overlap with the first wiring 111 and the second wiring 112 with the insulating film interposed therebetween and are in an electrically floating state may be formed. The semiconductor film can be formed at the same time as the semiconductor film 340. That is, by etching the crystalline silicon film 314 illustrated in FIG. 14B, as well as the semiconductor film 340, a single semiconductor film or a plurality of semiconductor films may be formed in regions where the first wiring 111 and the second wiring 112 are formed.

Embodiment 7

In Embodiment 6, the glass substrate 310 used in manufacturing the integrated circuit is directly used as the substrate of the photodetector. After the integrated circuit is manufactured, the integrated circuit can be separated from the glass substrate 310, so that the integrated circuit can be fixed to a different substrate. In this embodiment, a semiconductor device with such a structure is described.

For example, a separation layer (e.g., a silicon film) is formed between the glass substrate 310 and the integrated circuit and is removed by etching, so that the integrated circuit can be separated from the glass substrate 310. In this embodiment, a method by which the integrated circuit is separated from the glass substrate 310 by applying physical force to the separation layer and generating separation in the separation layer is described.

Figure 21A:
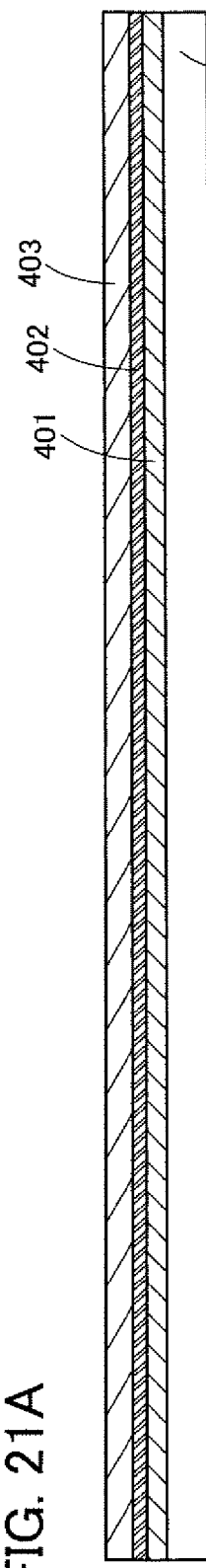
FIGS. 21A to 21C are cross-sectional views illustrating a method for manufacturing a photodetector in FIG. 20.

First, as illustrated in FIG. 21A, a 100-nm-thick silicon oxynitride film 401 is formed over the glass substrate 310 by PECVD, and a 30-nm-thick tungsten film 402 is formed over the silicon oxynitride film 401 by sputtering. The tungsten film 402 serves as a separation layer. The tungsten film is formed in order to easily generate separation between the base insulating films 311 and 312 of the integrated circuit and the glass substrate 310 by application of force. As well as the tungsten film, the separation layer can be formed using a metal film of molybdenum, titanium, tantalum, niobium, nickel, cobalt, zirconium, zinc, ruthenium, rhodium, palladium, osmium, iridium, or the like. Alternatively, the separation layer can be formed using an alloy film containing the above metal element as its main component. The thickness of the separation layer may be greater than or equal to 20 nm and less than or equal to 100 nm.

The silicon oxynitride film 401 is formed in order to improve adhesion between the separation layer and the glass substrate 310. As well as the silicon oxynitride film, a silicon oxide film, a silicon nitride oxide film, a silicon nitride film, a metal oxide film, or the like can be formed by sputtering or PECVD.

Next, a surface of the tungsten film 402 is oxidized in order to generate separation between the base insulating films and the tungsten film 402 prior to the other portions. A method for oxidizing the tungsten film 402 is as follows: thermal oxidation treatment, surface treatment using oxygen or N$_2$O plasma, surface treatment using a solution having strong oxidative power, such as ozone water, a method for forming an oxide film over the tungsten film 402 by sputtering, or the like. In this embodiment, a method for forming a 200-nm-thick silicon oxide film by sputtering is employed. Alternatively, instead of oxidizing the surface of the tungsten film 402, separation between the base insulating films and the tungsten film 402 can be generated prior to the other portions by nitriding the surface of the tungsten film 402 by plasma treatment or heat treatment. Note that also in the case where a film other than the tungsten film is formed as the separation layer, oxidation treatment or nitriding treatment may be performed in a manner similar to that of the tungsten film 402.

Figure 21B:
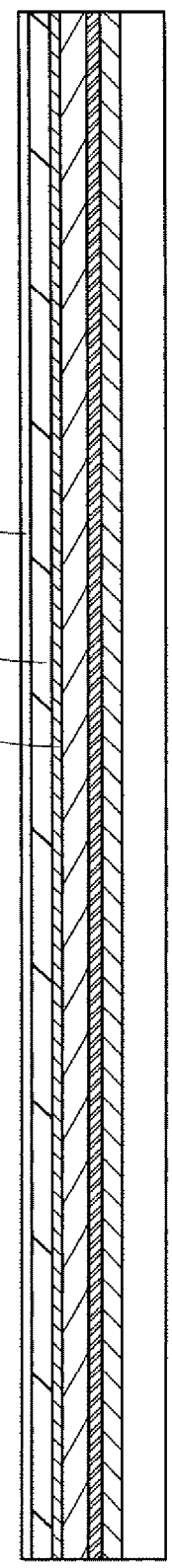

Next, over the silicon oxide film 403, the silicon nitride oxide film 311 and the silicon oxynitride film 312 which serve as the base insulating films, and the amorphous silicon film 313 which is used for the semiconductor film 340 are formed as in FIG. 14A (FIG. 21B).

Figure 21C:
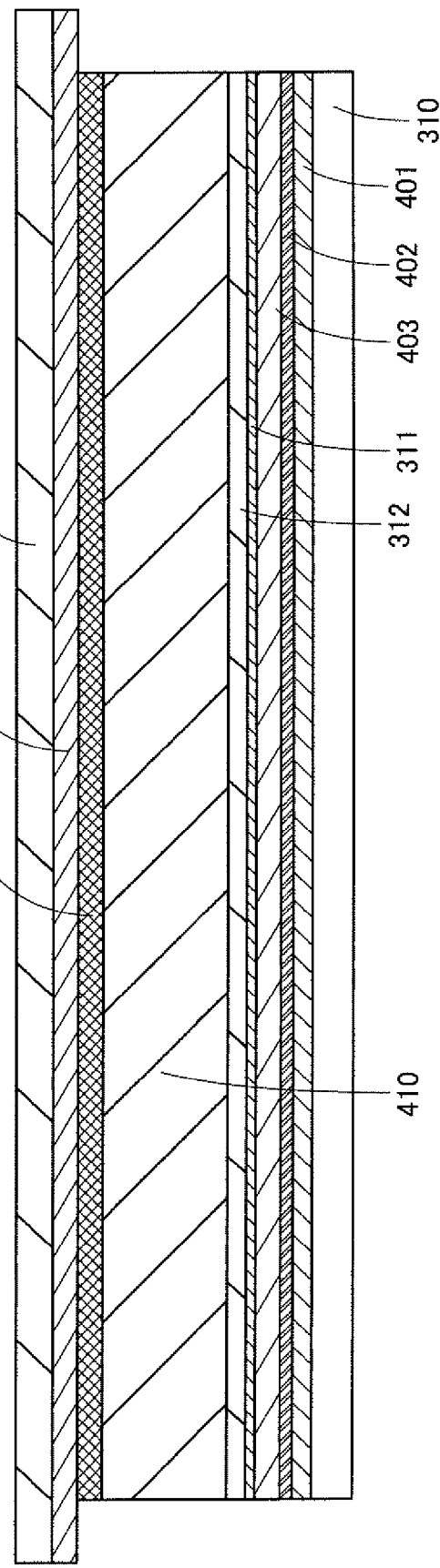

The following steps are performed in a manner similar to that of the manufacturing step in Embodiment 6 so that the integrated circuit, the VDD terminal 102, and the VSS terminal 103 are completed. In FIG. 21C, a portion denoted by reference numeral 410 illustrates the integrated circuit formed over the silicon oxynitride film 312, and the VDD terminal 102 and the VSS terminal 103 which are electrically connected to the integrated circuit. Hereinafter, this portion is referred to as the integrated circuit portion 410.

Subsequently, as illustrated in FIG. 21C, a base substrate 411 is fixed above the integrated circuit portion 410. A glass substrate, a quartz substrate, a metal substrate, a ceramic substrate, a plastic substrate, or the like can be used as the base substrate 411. The base substrate 411 is removed after the integrated circuit portion 410 is fixed to a different substrate. Thus, the base substrate 411 is fixed so as to be easily separated from the integrated circuit portion 410. In this embodiment, the base substrate 411 is fixed above the integrated circuit portion 410 by using a two-sided adhesive tape 413. As the two-sided adhesive tape 413, a sheet whose opposite surfaces are covered with a separation adhesive agent is used. A separation adhesive agent refers to an adhesive agent whose adhesion is weakened by heat, light, or the like. Here, the two-sided adhesive tape 413 using a heat separation adhesive agent is used. Further, in this embodiment, in order to facilitate the fixing of the base substrate 411, a top surface of the integrated circuit portion 410 is flattened by forming a soluble resin layer 412 over the integrated circuit portion 410.

Figure 22A:
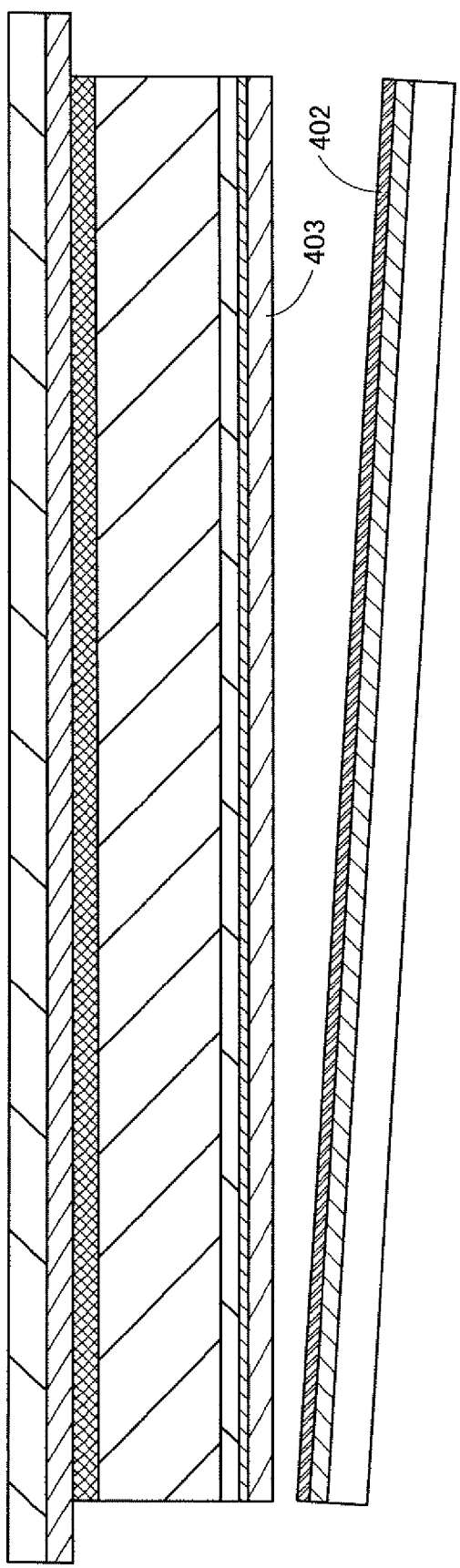
FIGS. 22A and 22B are cross-sectional views illustrating the method for manufacturing a photodetector after the step in FIG. 21C.
Figure 22B:
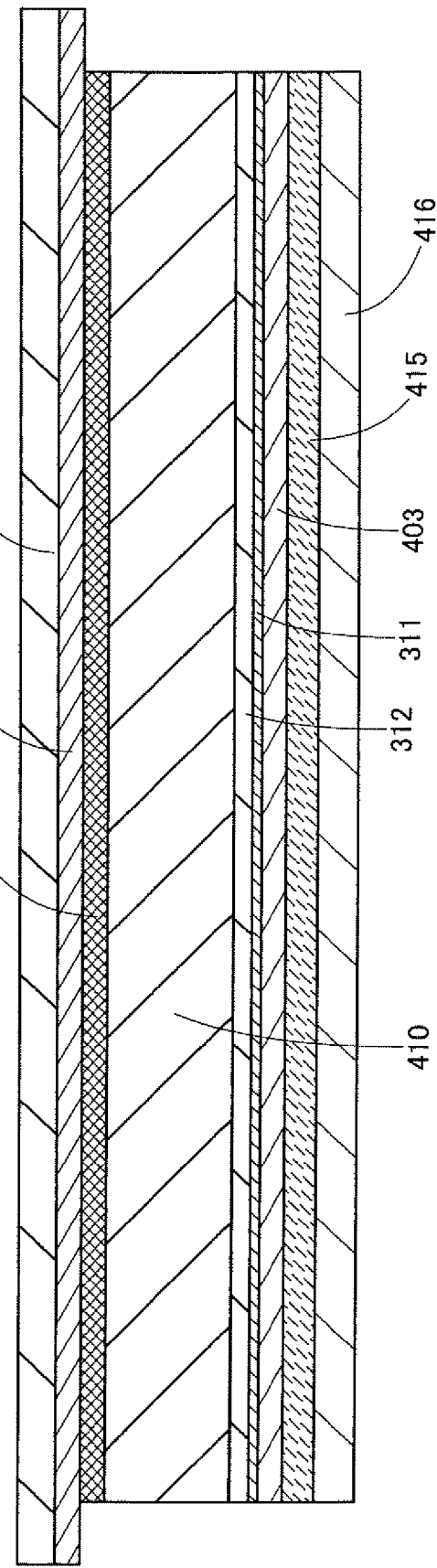

Next, as illustrated in FIG. 22A, separation between the tungsten film 402 and the silicon oxide film 403 is generated so that the integrated circuit portion 410 is separated from the glass substrate 310. In this embodiment, the integrated circuit portion 410 can be separated from the glass substrate 310 by using a method of application of physical force. For example, the integrated circuit portion 410 can be separated from the glass substrate 310 by using a load which uses a component having a sharp edge such as a wedge, a person's hand, wind pressure of gas blown from a nozzle, or the like.

A flexible substrate 416 is attached to the silicon oxide film 403 which is exposed by the separation of the glass substrate 310 by using an adhesive agent 415. For the adhesive agent 415, any of a variety of curable adhesive agents, such as a reactive-curable adhesive agent; a thermosetting adhesive agent; a photo-curing adhesive agent such as a UV curable adhesive agent; or an anaerobic-curable adhesive agent can be used. In this embodiment, an epoxy resin is used as the adhesive agent 415. In addition, for the flexible substrate 416, a film formed using polyimide, polyethylene naphthalate, polyethylene terephthalate, or the like can be used.

Next, the base substrate 411 is removed from the integrated circuit portion 410. By the heating, the adhesion of the two-sided adhesive tape 413 is decreased so that the base substrate 411 is removed from the integrated circuit portion 410 together with the two-sided adhesive tape 413. Subsequently, by cleaning the integrated circuit portion 410 with pure water, the soluble resin layer 412 is dissolved and is removed from the integrated circuit portion 410.

Figure 23:
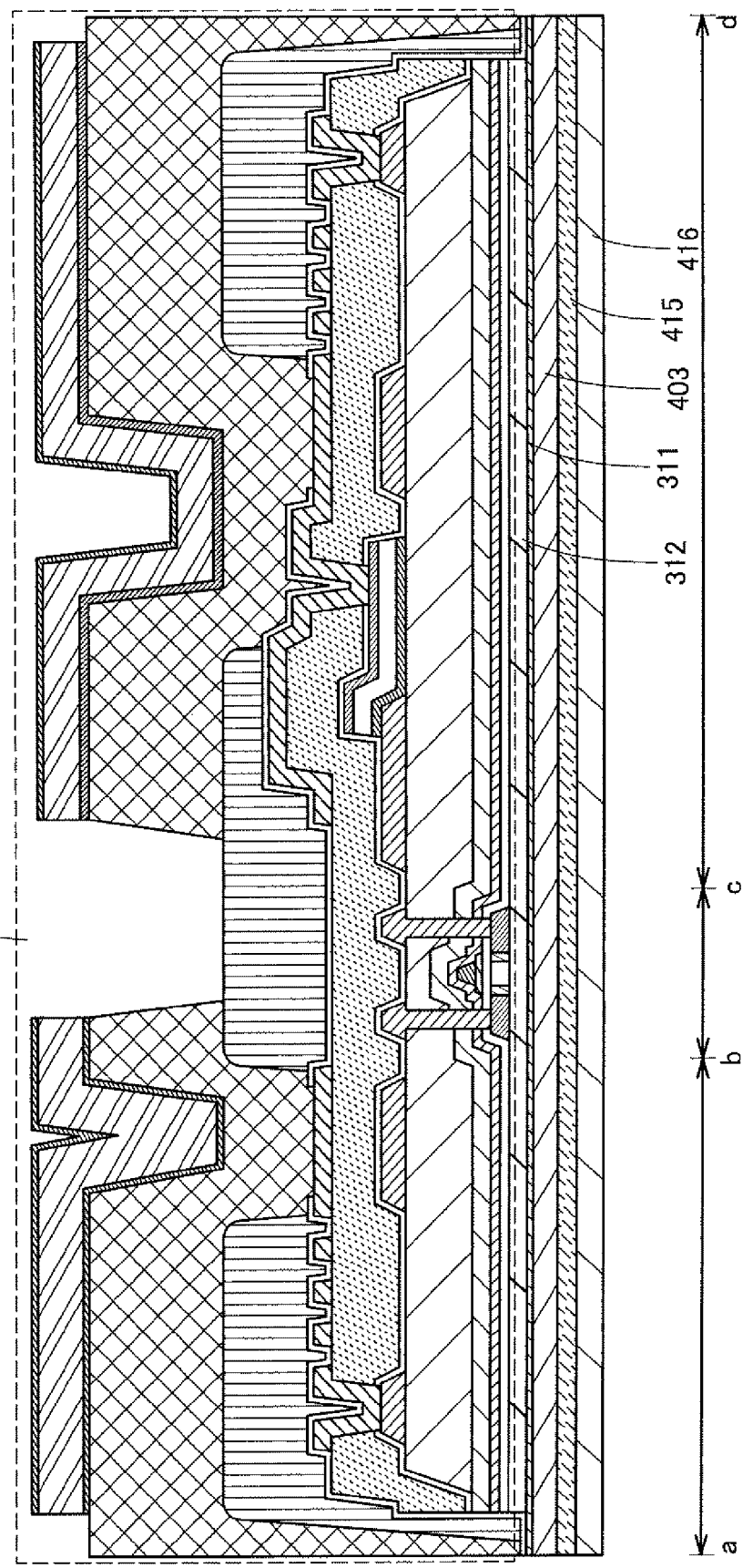
FIG. 23 is a cross-sectional views illustrating the method for manufacturing a photodetector after the step in FIG. 22B.

Through the above steps, the integrated circuit portion 410 is fixed above the flexible substrate 416, as illustrated in FIG. 23. Note that in FIG. 23, a method for the illustration of the layered structure of the photodetector is the same as that of FIG. 11. Next, as in Embodiment 6, by cutting the flexible substrate 416 and dividing the integrated circuit portion 410 into separate portions in accordance with the number of photodetectors, the photodetector is completed. By removing the glass substrate 310 used for manufacturing the integrated circuit and by using the flexible substrate 416 formed using a film or the like as the base substrate of the integrated circuit, the weight and the thickness of the photodetector can be reduced.

This embodiment can be combined with any of other embodiments as appropriate. Further, this embodiment is not limited to the photodetector and can be applied to a variety of manufacturing methods of integrated circuits. That is, according to this embodiment, a variety of flexible semiconductor devices can be manufactured.

Embodiment 8

In Embodiment 6, the integrated circuit is manufactured using the crystalline semiconductor film obtained by crystallizing the amorphous semiconductor film. A single crystal semiconductor film is formed over a glass substrate and can be used for manufacturing an integrated circuit. In this embodiment, a method for forming a single crystal semiconductor film over a glass substrate is described.

As illustrated in FIG. 24A, a glass substrate 500 is prepared. The glass substrate 500 is a base substrate for supporting a single crystal semiconductor layer separated from a single crystal semiconductor substrate. As the glass substrate 500, it is preferable to use a substrate having a coefficient of thermal expansion greater than or equal to $25 \times 10^{-7}/°$ C. and less than or equal to $50 \times 10^{-7}/°$ C. (preferably greater than or equal to $30 \times 10^{-7}/°$ C. and less than or equal to $40 \times 10^{-7}/°$ C.) and a strain point higher than or equal to 580° C. and lower than or equal to 680° C. (preferably higher than or equal to 600° C. and lower than or equal to 680° C.). In addition, in order to suppress the contamination of a semiconductor device, a non-alkali glass substrate is preferably used as the glass substrate. As a non-alkali glass substrate, for example, an aluminosilicate glass substrate, an aluminoborosilicate glass substrate, a barium borosilicate glass substrate, or the like can be used.

Alternatively, instead of the glass substrate 500, an insulating substrate formed using an insulator, such as a ceramic substrate, a quartz substrate, or a sapphire substrate; a conductive substrate formed using a conductive material such as metal or stainless steel; a semiconductor substrate formed using a semiconductor such as silicon or gallium arsenide; or the like can be used.

As illustrated in FIG. 24B, a single crystal semiconductor substrate 501 is prepared. By attaching the semiconductor layer separated from the single crystal semiconductor substrate 501 to the glass substrate 500, an SOI substrate is formed. As the single crystal semiconductor substrate 501, a semiconductor substrate formed using an element belonging to Group 14, such as silicon, germanium, silicon germanium, or silicon carbide can be used. In addition, in this embodiment mode, a substrate which is larger than the semiconductor substrate 501 is used as the glass substrate 500.

First, as illustrated in FIG. 24C, an insulating film 502 is formed on a single crystal semiconductor substrate 501. The insulating film 502 can have either a single-layer structure or a layered structure. The thickness of the insulating film 502 can be greater than or equal to 5 nm and less than or equal to 400 nm. As a film used for the insulating film 502, an insulating film containing silicon or germanium such as silicon oxide, silicon nitride, silicon oxynitride, silicon nitride oxide, germanium oxide, germanium nitride, germanium oxynitride, or germanium nitride oxide as its component can be used. Alternatively, an insulating film containing a metal oxide such as aluminum oxide, tantalum oxide, or hafnium oxide; an insulating film containing a metal nitride such as aluminum nitride; an insulating film containing a metal oxynitride such as aluminum oxynitride; or an insulating film containing a metal nitride oxide such as aluminum nitride oxide can be used. Such an insulating film used for the insulating film 502 can be formed by a method such as CVD, sputtering, or oxidation or nitriding of the single crystal semiconductor substrate 501.

In addition, at least one film which prevents diffusion of impurities from the glass substrate 500 into the single crystal semiconductor film is preferably provided for the insulating film 502. As such a film, a silicon nitride film, a silicon nitride oxide film, an aluminum nitride film, an aluminum nitride oxide film, or the like can be used. When such a film is provided, the insulating film 502 can serve as a barrier layer.

For example, in the case where the insulating film 502 is formed as a barrier layer with a single-layer structure, the insulating film 502 can be formed using a silicon nitride film, a silicon nitride oxide film, an aluminum nitride film, or an aluminum nitride oxide film having a thickness greater than or equal to 5 nm and less than or equal to 200 nm.

In the case where the insulating film 502 is a film having a two-layer structure, which serves as a barrier layer, an upper layer is formed using an insulating film having an excellent barrier function. The upper layer can be formed using a silicon nitride film, a silicon nitride oxide film, an aluminum nitride film, or an aluminum nitride oxide film having a thickness greater than or equal to 5 nm and less than or equal to 200 nm. Although such a film has a high blocking effect of preventing impurity diffusion, it has high internal stress. Therefore, as an insulating film of a lower layer, which is in contact with the single crystal semiconductor substrate 501, it is preferable to select a film having an effect of relieving the stress of an insulating film of the upper layer. As such an insulating film, a silicon oxide film, a silicon oxynitride film, a thermal oxide film formed by thermally oxidizing the single crystal semiconductor substrate 501, or the like can be used. The thickness of the insulating film of the lower layer can be greater than or equal to 5 nm and less than or equal to 300 nm.

In this embodiment, the insulating film 502 has a two-layer structure including an insulating film 502a and an insulating film 502b. As the insulating film 502a, a 100-nm-thick silicon oxynitride film is formed using $SiH_4$ and $N_2O$ as a source gas by PECVD. As the insulating film 502b, a 50-nm-thick silicon nitride oxide film is formed using $SiH_4$, $N_2O$, and $NH_3$ as a source gas by PECVD.

Next, as illustrated in FIG. 24D, the single crystal semiconductor substrate 501 is irradiated with an ion beam 505 including ions accelerated by an electric field through the insulating film 502, so that a weakened layer 503 is formed in the single crystal semiconductor substrate 501 to reach a predetermined depth from the surface of the single crystal semiconductor substrate 501. This ion irradiation step is a step in which the single crystal semiconductor substrate 501 is irradiated with the ion beam 505 including accelerated ion species, so that elements included in the ion species are added to the single crystal semiconductor substrate 501. When the single crystal semiconductor substrate 501 is irradiated with the ion beam 505, a layer in which a crystal structure is brittle is formed at a predetermined depth in the single crystal semiconductor substrate 501 by the impact of the accelerated ion species, which corresponds to the weakened layer 503. The depth of a region where the weakened layer 503 is formed can be controlled by the acceleration energy of the ion beam 505 and the injection angle of the ion beam 505. The acceleration energy can be adjusted by accelerating voltage, dosage, or the like. The weakened layer 503 can be formed at the same or substantially the same depth as the average depth at which the ions enter. That is, the thickness of the semiconductor layer which is separated from the single crystal semiconductor substrate 501 is determined based on the depth at which the ions enter. The depth at which the weakened layer 503 is formed is greater than or equal to 50 nm and less than or equal to 500 nm, preferably greater than or equal to 50 nm and less than or equal to 200 nm.

In order to irradiate the single crystal semiconductor substrate 501 with the ion beam 505, an ion doping method in which mass separation is not performed can be used instead of an ion implantation method in which mass separation is performed.

In the case of using hydrogen ($H_2$) as a source gas $H^+$, $H_2^+$, and $H_3^+$ can be produced by exciting a hydrogen gas. The proportion of ion species produced from the source gas can be changed by adjusting a plasma excitation method, pressure in an atmosphere for generating plasma, the supply amount of the source gas, or the like. In the case of forming the weakened layer 503 by an ion doping method, it is preferable that $H_3^+$ occupy 70% or more of the total amount of $H^+$, $H_2^+$, and $H_3^+$ in the ion beam 505, and it is more preferable that $H_3^+$ occupy 80% or more of the total amount.

In order to form the weakened layer 503 at a shallow region, it is necessary to lower the accelerating voltage of the ions Accordingly, the takt time in the ion irradiation step is shortened. Thus, by increasing the proportion of $H_3^+$ ions in the plasma produced by exciting the hydrogen gas, atomic hydrogen (H) can be efficiently added to the single crystal semiconductor substrate 501. This is because $H_3^+$ ions are three times as large in mass as $H^+$ ions, so that in the case of adding hydrogen atoms at the same depth, the accelerating voltage of the $H_3^+$ ions can be three times as high as that of the $H^+$ ions. When the accelerating voltage of the ions is increased, the takt time in the ion irradiation step can be shortened, so that productivity and throughput can be improved. Therefore, since variation in the average depth at which the hydrogen ions enter is reduced by increasing the proportion of the $H_3^+$ ions included in the ion beam 505, in the single crystal semiconductor substrate 501, the hydrogen concentration profile in the depth direction becomes steeper and the peak position of the profile can shift to a shallow region.

In the case of performing ion irradiation by using the hydrogen gas by an ion doping method, the accelerating voltage can be made higher than or equal to 10 kV and lower than or equal to 200 kV, and the dosage can be made greater than or equal to $1\times10^{16}$ ions/cm$^2$ and less than or equal to $6\times10^{16}$ ions/cm$^2$. By the irradiation with the hydrogen ions under this condition, the weakened layer 503 can be formed in a region at a depth greater than or equal to 50 nm and less than or equal to 500 nm in the single crystal semiconductor substrate 501, which could vary depending on the ion species included in the ion beam 505 and the proportion of the ion species.

For example, in the case where the single crystal semiconductor substrate 501 is a single crystal silicon substrate, the insulating film 502a is a 50-nm-thick silicon oxynitride film, and the insulating film 502b is a 50-nm-thick silicon nitride oxide film, a semiconductor layer having a thickness of approximately 120 nm can be separated from the single crystal semiconductor substrate 501 in the following condition; a hydrogen source gas, an accelerating voltage of 40 kV, and a dosage of $2\times10^{16}$ ions/cm$^2$. Alternatively, when the irradiation with the hydrogen ions is performed under the above condition except that the insulating film 502a is a 100-nm-thick silicon oxynitride film, the semiconductor layer having a thickness of approximately 70 nm can be separated from the single crystal semiconductor substrate 501.

Helium (He) can be used as a source gas in the ion irradiation step. Since most of the ion species produced by exciting helium are He$^+$, the single crystal semiconductor substrate 501 can be irradiated with He$^+$ as main ions even in an ion doping method in which mass separation is not performed. Thus, microvoids can be efficiently formed in the weakened layer 503 by an ion doping method. When ion irradiation is performed using helium by an ion doping method, the accelerating voltage can be made higher than or equal to 10 kV and lower than or equal to 200 kV, and the dosage can be made greater than or equal to $1\times10^{16}$ ions/cm$^2$ and less than or equal to $6\times10^{16}$ ions/cm$^2$.

A halogen gas such as a chlorine gas (a $Cl_2$ gas) or a fluorine gas (a $F_2$ gas) can be used as the source gas.

After the weakened layer 503 is formed, an insulating film 504 is formed on a top surface of the insulating film 502, as illustrated in FIG. 24E. In a step of forming the insulating film 504, the single crystal semiconductor substrate 501 is heated at a temperature at which an element or a molecule which is added to the weakened layer 503 is not separated out, preferably at lower than or equal to 350° C. That is, this heating temperature is a temperature at which the gas is not released from the weakened layer 503. Note that the insulating film 504 can be formed before the ion irradiation step. In this case, the process temperature at the time of forming the insulating film 504 can be set to higher than or equal to 350° C.

The insulating film 504 is a film for forming a bonding surface which is smooth and hydrophilic on the surface of the single crystal semiconductor substrate 501. Therefore, the insulating film 504 preferably has a mean surface roughness Ra of less than 0.8 nm, and a root-mean-square roughness Rms of less than 0.9 nm. In addition, the thickness of the insulating film 504 can be made greater than or equal to 10 nm and less than or equal to 200 nm. The thickness of the insulating film 504 is preferably greater than or equal to 5 nm and less than or equal to 500 nm, more preferably greater than or equal to 10 nm and less than or equal to 200 nm. As the insulating film 504, a silicon oxide film or a silicon oxynitride film can be formed. Here, a 50-nm-thick silicon oxide film is formed using TEOS and $O_2$ as a source gas by PECVD.

Note that one of the insulating film 502 and the insulating film 504 is not necessarily formed. In addition, an insulating film having a single-layer structure or a layered structure may be formed over the glass substrate 500. This insulating film can be formed in a manner similar to that of the insulating film 502. In the case where the insulating film has a layered structure, the insulating film which serves as tile barrier layer is preferably formed in contact with the glass substrate 500. Further, in the case of forming the insulating film over the glass substrate 500, the insulating film 502 and the insulating film 504 are not necessarily formed.

FIG. 24F is a cross-sectional view for illustrating a bonding step, which illustrates a state where the glass substrate 500 and the single crystal semiconductor substrate 501 are attached to each other. In performing the bonding step, first the glass substrate 500, and the single crystal semiconductor substrate 501 on which the insulating films 502 and 504 are formed are subjected to ultrasonic cleaning. The ultrasonic cleaning is preferably megahertz ultrasonic cleaning (megasonic cleaning). After the megahertz ultrasonic cleaning, either one or both the glass substrate 500 and the single crystal semiconductor substrate 501 can be cleaned with ozone water. By cleaning either one or both the glass substrate 500 and the single crystal semiconductor substrate 501 with ozone water, organic substances can be removed and the surface can be made more hydrophilic.

After the cleaning step, the glass substrate 500 and the single crystal semiconductor substrate 501 are attached to each other with the insulating film 504 interposed therebetween. When the surface of the glass substrate 500 and a surface of the insulating film 504 are attached to each other, a chemical bond (e.g. a hydrogen bond) is formed at an interface between the glass substrate 500 and the insulating film 504, so that the glass substrate 500 and the insulating film 504 are bonded to each other. Since the bonding step can be performed at room temperature without performing heat treatment, a substrate with low heat resistance, like the glass substrate 500, can be used.

After the glass substrate 500 and the single crystal semiconductor substrate 501 are attached to each other, heat treatment for increasing bonding strength at the interface between the glass substrate 500 and the insulating film 504 is preferably performed. This heat treatment is performed at a temperature at which the weakened layer 503 does not crack, specifically, can be performed at a temperature higher than or equal to 70° C. and lower than or equal to 300° C.

Subsequently, heat treatment is performed at higher than or equal to 400° C., and the single crystal semiconductor substrate 501 is divided along the weakened layer 503 so that a single crystal semiconductor film 506 is separated from the single crystal semiconductor substrate 501. FIG. 24G is a cross-sectional view illustrating a separation step of separating the single crystal semiconductor film 506 from the single crystal semiconductor substrate 501. As illustrated in FIG. 24G, the single crystal semiconductor film 506 is formed over the glass substrate 500 through the separation step. An element denoted by reference numeral 501A is the single crystal semiconductor substrate 501 from which the single crystal semiconductor film 506 is separated.

By performing the heat treatment at higher than or equal to 400° C., the hydrogen bond formed at the interface between the glass substrate 500 and the insulating film 504 can be changed into a covalent bond. Thus, the bonding strength between the glass substrate 500 and the insulating film 504 is increased. As the temperature rises, the element added in the ion irradiation step is separated out to the microvoids formed in the weakened layer 503, so that internal pressure is increased. As the pressure rises, the volume of the microvoids formed in the weakened layer 503 is changed, so that the weakened layer 503 cracks. Thus, the single crystal semiconductor substrate 501 is divided along the weakened layer 503. Since the insulating film 504 is bonded to the glass substrate 500, the single crystal semiconductor film 506 separated from the single crystal semiconductor substrate 501 is fixed over the glass substrate 500. The heat treatment for separating the single crystal semiconductor film 506 from the single crystal semiconductor substrate 501 is performed at a temperature which is not higher than the strain point of the glass substrate 500, specifically, can be performed at a temperature higher than or equal to 400° C. and lower than or equal to 700° C.

After the separation step illustrated in FIG. 24G is completed, an SOI substrate 510 in which the single crystal semiconductor film 506 is attached to the glass substrate 500 is formed. The SOI substrate 510 is a substrate which has a multi-layer structure where the insulating film 504, the insulating film 502, the single crystal semiconductor film 506 are sequentially stacked over the glass substrate 500 and in which the insulating film 502 and the insulating film 504 are bonded to each other. In the case where the insulating film 502 is not formed, the SOI substrate 510 is a substrate win which the insulating film 504 and the single crystal semiconductor film 506 are bonded to each other.

Note that the heat treatment for separating the single crystal semiconductor film 506 from the single crystal semiconductor substrate 501 can be performed successively in the same apparatus as in the heat treatment for increasing the bonding strength. Alternatively, the two heat treatments can be performed in different apparatuses. For example, in the case of using the same furnace, heat treatment is performed at a treatment temperature of 200° C. for a treatment time of 2 hours. Subsequently, the temperature is raised to 600° C., and heat treatment is performed at 600° C. for a treatment time of 2 hours. Then, the temperature is lowered from lower than or equal to 400° C. to room temperature, and the single crystal semiconductor substrate 501A and the SOI substrate 510 are taken out from the furnace.

In the case where the heat treatments are performed in different apparatuses, for example, after heat treatment is performed at a treatment temperature of 200° C. for a treatment time of 2 hours in a furnace, the glass substrate 500 and the single crystal semiconductor substrates 501 which are attached to each other are carried out from the furnace. Subsequently, heat treatment is performed at a treatment temperature higher than or equal to 600° C. and lower than or equal to 700° C. for a treatment time longer than or equal to 1 minute and shorter than or equal to 30 minutes, so that the single crystal semiconductor substrate 501 is divided along the weakened layer 503.

Crystal defects are formed in the single crystal semiconductor film 506 in the SOI substrate 510 due to the formation of the weakened layer 503, the separation step, or the like, and the flatness of the surface of the single crystal semiconductor film 506 is damaged. Therefore, in order to reduce the crystal defects and to flatten the surface, the single crystal semiconductor film 506 may be irradiated with laser light and melted to be recrystallized. Alternatively, in order to remove the damage of the surface of the single crystal semiconductor film 506 so that the surface is flattened, the surface of the single crystal semiconductor film 506 is preferably polished by a chemical mechanical polishing (CMP) apparatus.

By using the SOI substrate 510 of this embodiment, a variety of semiconductor devices as in Embodiment 6 can be manufactured.

Embodiment 9

By attaching the photodetector obtained in Embodiment 6 to an electronic device, the operations of the electronic device can be controlled in accordance with detection signals of the photodetector. For example, by mounting the photodetector on an electronic device having a display panel, the luminance of the display panel can be adjusted in accordance with detection signals of the photodetector. In this embodiment, several examples of such an electronic device are described with reference to FIGS. 25A to 25F.

Figure 25A:
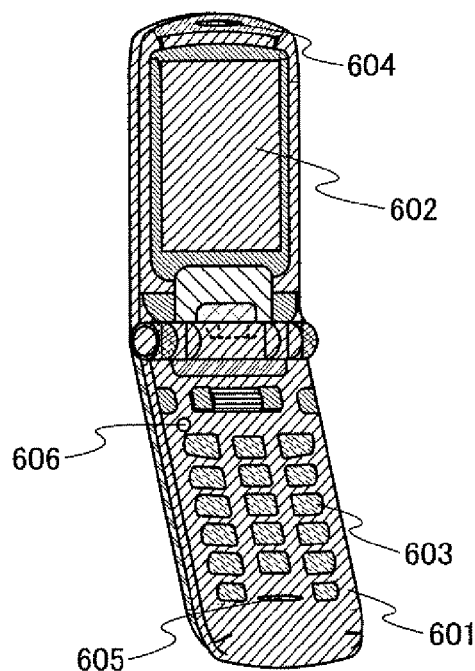
FIGS. 25A and 25B are outline views of mobile phones according to an embodiment of the present invention.
Figure 25B:
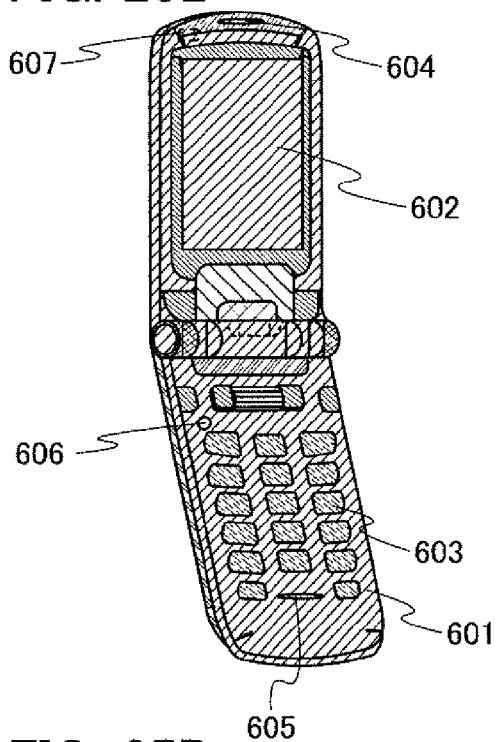

FIGS. 25A and 25B are outline views of mobile phones of this embodiment. The mobile phones in FIGS. 25A and 25B include a main body 601, a display panel 602, operation keys 603, an audio output portion 604, and an audio input portion 605. In addition, the main body 601 includes a photodetector 606. The mobile phones in FIGS. 25A and 25B each have a function of controlling the luminance of the display panel 602 in accordance with electrical signals detected in the photodetector 606. Further, in the mobile phone in FIG. 25B, a photodetector 607 for detecting the luminance of a backlight in the display panel 602 is mounted on the main body 601.

Figure 25C:
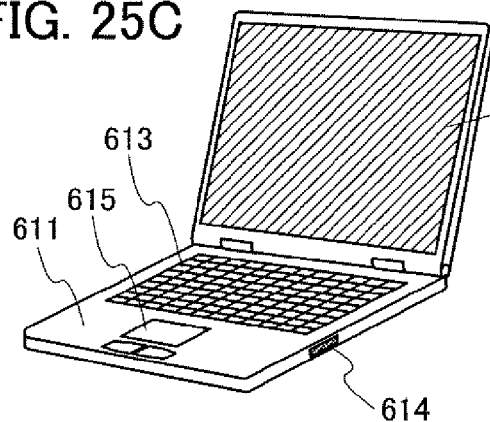
FIG. 25C is an outline view of a computer according to an embodiment of the present invention.

FIG. 25C is an outline view of a computer of this embodiment. The computer includes a main body 611, a display panel 612, a keyboard 613, an external connection port 614, a pointing device 615, and the like. Further, a photodetector (not illustrated) for detecting the luminance of a backlight in the display panel 612 is mounted on the main body 611.

Figure 25D:
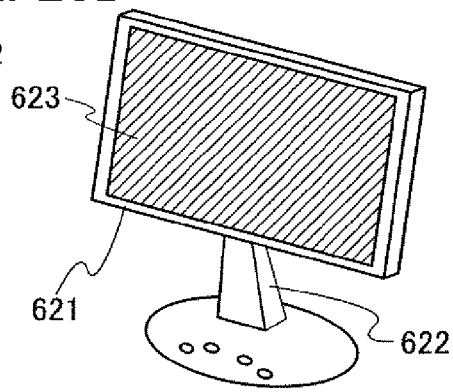
FIG. 25D is an outline view of a display device according to an embodiment of the present invention.

FIG. 25D is an outline view of a display device of this embodiment. A TV receiver, a monitor of a computer, or the like corresponds to the display device. The display device includes a housing 621, a support base 622, a display panel 623, and the like. A photodetector (not illustrated) for detecting the luminance of a backlight in the display panel 623 is mounted on the housing 621.

Figure 25E:
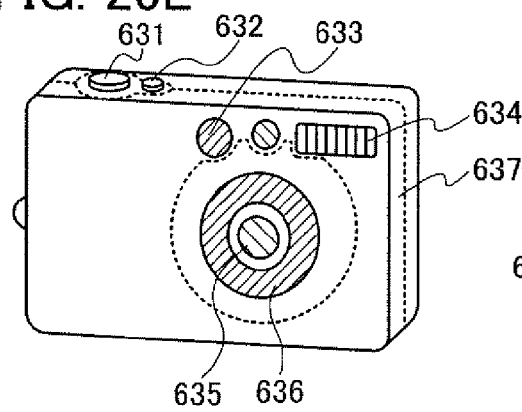
FIGS. 25E and 25F are outline views of a digital camera according to an embodiment of the present invention.
Figure 25F:
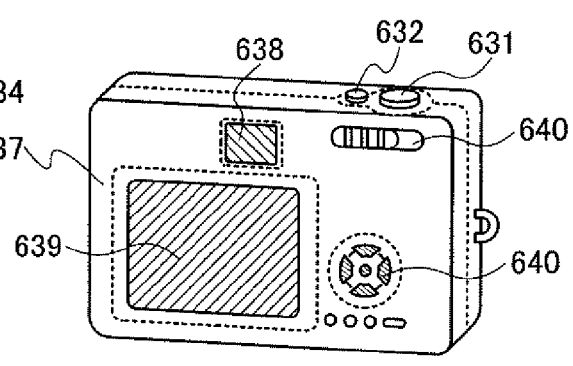

FIG. 25E is an outline view of a digital camera of this embodiment when viewed from the front side. FIG. 25F is an outline view of the digital camera in FIG. 25E when viewed from the back side. The digital camera includes a release button 631, a main switch 632, a finder window 633, a flashlight 634, a lens 635, a lens barrel 636, a housing 637, a finder eyepiece window 638, a display panel 639, operation buttons 640, and the like.

The main switch 632 switches on/off of a power source of the digital camera by being pressed or rotated. The operation buttons 640 are buttons for a variety of functions, which are provided on the back side of the digital camera, and include a setup button, a menu button, a display button, a functional button, a selection button, and the like. When the release button 631 is pressed down halfway, a focusing adjusting mechanism and an exposure adjusting mechanism are operated. When the release button 631 is fully pressed down, a shutter is opened. The flashlight 634 is provided in an upper portion of the front side of the digital camera. When the luminance of an object is low, the flashlight 634 emits light at the same time as the release button 631 is pressed down and the shutter is opened.

The lens barrel 636 moves the position of the lens to adjust the focus. At the time of photographing, the lens barrel 636 is slid out to move the lens 635 forward. Further, when the camera is carried, the lens 635 is moved backward and made compact Note that although a structure in which the lens barrel 636 is slid out so that an object can be enlarged and photographed is used in this embodiment, the structure of the camera is not limited this. A digital camera may be used in which zoom shooting can be performed without sliding out the lens barrel 636 by using a photographing optical system inside the housing 637.

By mounting the photodetector on the digital camera, the luminance of a photographing environment can be detected in the photodetector. Exposure, shutter speed, and the like can be adjusted in accordance with electrical signals detected in the photodetector.

This application is based on Japanese Patent Application serial no. 2008-108896 filed with Japan Patent Office on Apr. 18, 2008, the entire contents of which are hereby incorporated by reference.

What is claimed is:

1. A semiconductor device comprising:
a first dielectric;
a first wiring to which a first power supply potential is applied;
a second wiring to which a second power supply potential is applied;
a circuit including a plurality of semiconductor elements;
a second dielectric; and
a film which is at least one of a semiconductor film and a conductive film;
wherein the second wiring is formed adjacent to the first wiring with the first dielectric interposed between the first wiring and the second wiring,
wherein the circuit is electrically connected to the first wiring and the second wiring,
wherein the circuit is surrounded by the first wiring and the second wiring,
wherein the film overlaps with the first wiring and the second wiring with the second dielectric interposed between the film and each of the first wiring and the second wiring, and
wherein the film is in an electrically floating state.

2. The semiconductor device according to claim 1, wherein the circuit is surrounded twice or more by the first wiring and the second wiring.

3. The semiconductor device according to claim 1, wherein the circuit includes a photoelectric conversion element and an amplifier circuit amplifying current flowing to the photoelectric conversion element.

4. The semiconductor device according to claim 1, wherein the circuit is formed over a glass substrate.

5. The semiconductor device according to claim 1 wherein the circuit is an integrated circuit.

6. A semiconductor device comprising:
a first wiring to which a first power supply potential is applied;
a second wiring to which a second power supply potential is applied;
a first insulating film;
a second insulating film formed over the first insulating film;
a circuit which includes a plurality of semiconductor elements; and
a film which is at least one of a semiconductor film and a conductive film,
wherein the first wiring includes a first conductive film formed over the first insulating film,
wherein the second wiring includes a second conductive film formed over the first insulating film,
wherein the second conductive film is adjacent to the first conductive film with the second insulating film interposed between the first conductive film and the second conductive film,
wherein the circuit is surrounded by the first conductive film and the second conductive film, and
wherein the first power supply potential and the second power supply potential are applied to the circuit through the first conductive film and the second conductive film, and
wherein the film which is at least one of a semiconductor film and a conductive film overlaps with the first conductive film and the second conductive film with the first insulating film interposed between the film which is at least one of a semiconductor film and a conductive film and each of the first conductive film and the second conductive film.

7. The semiconductor device according to claim 6, wherein the circuit is surrounded twice or more by the first conductive film and the second conductive film.

8. The semiconductor device according to claim 6, wherein the circuit includes a photoelectric conversion element and an amplifier circuit amplifying current flowing to the photoelectric conversion element.

9. The semiconductor device according to claim 6, wherein the circuit is formed over a glass substrate.

10. The semiconductor device according to claim 6 wherein the circuit is an integrated circuit.

11. A semiconductor device comprising:
a first wiring to which a first power supply potential is applied;
a second wiring to which a second power supply potential is applied;
a first insulating film;
a second insulating film formed over the first insulating film;
a third insulating film formed over the second insulating film; and
a circuit which includes a plurality of semiconductor elements,
wherein the first wiring includes a first conductive film formed over the first insulating film,
wherein the second wiring includes a second conductive film formed over the first insulating film,
wherein the second conductive film is adjacent to the first conductive film with the second insulating film interposed between the first conductive film and the second conductive film,
wherein the first wiring further includes a third conductive film formed over the first conductive film and the second conductive film with the second insulating film interposed between the first conductive film and the second conductive film, and the third conductive film,
wherein the second wiring further includes a fourth conductive film formed over the first conductive film and the second conductive film with the second insulating film interposed between the first conductive film and the second conductive film, and the fourth conductive film,
wherein the fourth conductive film is adjacent to the third conductive film with the third insulating film interposed between the third conductive film and the fourth conductive film,
wherein the circuit is surrounded by the first to fourth conductive films, and
wherein the first power supply potential and the second power supply potential are applied to the circuit through the first conductive film and the third conductive film, and the second conductive film and the fourth conductive film, respectively.

12. The semiconductor device according to claim 11,
wherein the first conductive film and the fourth conductive film are adjacent to each other with the second insulating film interposed between the first conductive film and the fourth conductive film, and
wherein the second conductive film and the third conductive film are adjacent to each other with the second insulating film interposed between the second conductive film and the third conductive film.

13. The semiconductor device according to claim 11, further comprising a semiconductor film,
wherein the semiconductor film overlaps with the first to fourth conductive films,
wherein the semiconductor film is covered with the first insulating film, and
wherein the semiconductor film is in an electrically floating state.

14. The semiconductor device according to claim 11, further comprising a fifth conductive film,
wherein the fifth conductive film overlaps with the first to fourth conductive films,
wherein the fifth conductive film is covered with the first insulating film, and
wherein the fifth conductive film is in an electrically floating state.

15. The semiconductor device according to claim 11, wherein the circuit is surrounded twice or more by the first to fourth conductive films.

16. The semiconductor device according to claim 11, wherein the circuit includes a photoelectric conversion element and an amplifier circuit amplifying current flowing to the photoelectric conversion element.

17. The semiconductor device according to claim 11, wherein the circuit is formed over a glass substrate.

18. The semiconductor device according to claim 11 wherein the circuit is an integrated circuit.

19. A semiconductor device comprising:
a first insulating film;
a first conductive film on the first insulating film;
a second conductive film on the first insulating film, the second conductive film being adjacent to the first conductive film with a space therebetween;
a second insulating film over the first conductive film and the second conductive film;
a third conductive film being overlapped with the second conductive film with the second insulating film therebetween;
a fourth conductive film being overlapped with the first conductive film with the second insulating film therebetween;
a circuit which includes a plurality of semiconductor elements,
wherein the circuit is configured to be supplied with a first power supply potential through a first wiring comprising the first conductive film and the third conductive film, and the circuit is configured to be supplied with a second power supply potential through a second wiring comprising the second conductive film and the fourth conductive film.

20. The semiconductor device according to claim 19, further comprising a semiconductor film below the first insulating film,
wherein the semiconductor film overlaps with at least one of the first to fourth conductive films and is in an electrically floating state.

21. The semiconductor device according to claim 19, further comprising a fifth conductive film below the first insulating film,
wherein the fifth conductive film overlaps with at least one of the first to fourth conductive films and is in an electrically floating state.

22. The semiconductor device according to claim 19, wherein the circuit is surrounded twice or more by the first to fourth conductive films.

23. The semiconductor device according to claim 19, wherein the circuit includes a photoelectric conversion element and an amplifier circuit amplifying current flowing to the photoelectric conversion element.

24. The semiconductor device according to claim 19, wherein the circuit is formed over a glass substrate.

25. The semiconductor device according to claim 19 wherein the circuit is an integrated circuit.

* * * * *